United States Patent [19]
Itani

[11] Patent Number: 5,854,845
[45] Date of Patent: Dec. 29, 1998

[54] METHOD AND CIRCUIT FOR VOICE AUTOMATIC GAIN CONTROL

[75] Inventor: Tarek A. Itani, Collin, Tex.

[73] Assignee: InterVoice Limited Partnership, Reno, Nev.

[21] Appl. No.: 604,361

[22] Filed: Feb. 21, 1996

Related U.S. Application Data

[63] Continuation of Ser. No. 999,018, Dec. 31, 1992, abandoned.

[51] Int. Cl.$^6$ ...................................................... H03G 3/00
[52] U.S. Cl. ........................... 381/108; 381/107; 381/104; 455/234.1; 455/240.1; 455/219
[58] Field of Search .................................... 381/107, 108, 381/94, 104; 455/234.1, 240.1, 219, 220, 223

[56] References Cited

U.S. PATENT DOCUMENTS

| | | | |
|---|---|---|---|
| 4,328,465 | 5/1982 | Takaoka | 381/107 |
| 4,371,981 | 2/1983 | King | 455/219 |
| 4,989,074 | 1/1991 | Matsumoto | 455/234.1 |
| 5,267,322 | 11/1993 | Smith | 381/107 |

*Primary Examiner*—Munson Oh Harvey
*Attorney, Agent, or Firm*—Fulbright & Jaworski L.L.P.

[57] ABSTRACT

A system and method for automatically controlling signal gain and minimizing distortion due to widely varying signal levels are disclosed. The method comprises the steps of calculating an initial gain factor from a source signal and gradually varying the initial gain factor to within a preselected band of allowable values when the source signal is above a preselected minimum level and the initial gain factor is above the preselected band. The circuit comprises means for calculating an initial gain factor from a source signal and means for gradually varying the initial gain factor to within a preselected band of allowable values when the source signal is above a preselected minimum level and the initial gain factor is above the preselected band. The method and circuit are particularly adept at processing audio signals carrying spoken words, the signals characterized by periods of silence between the words.

58 Claims, 14 Drawing Sheets

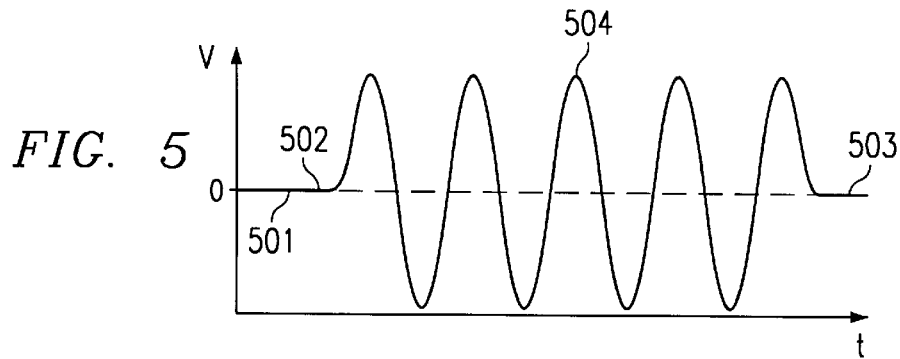
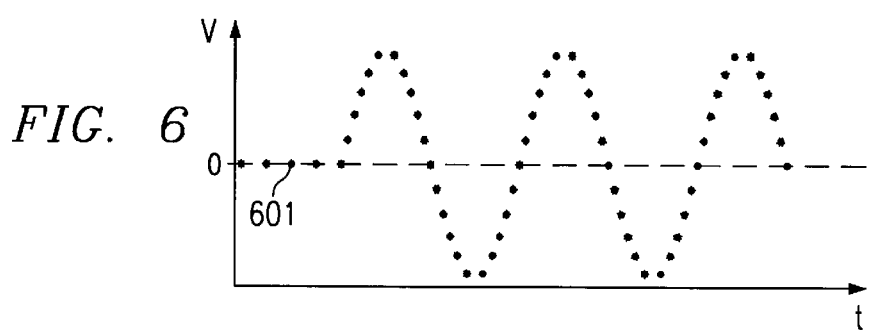
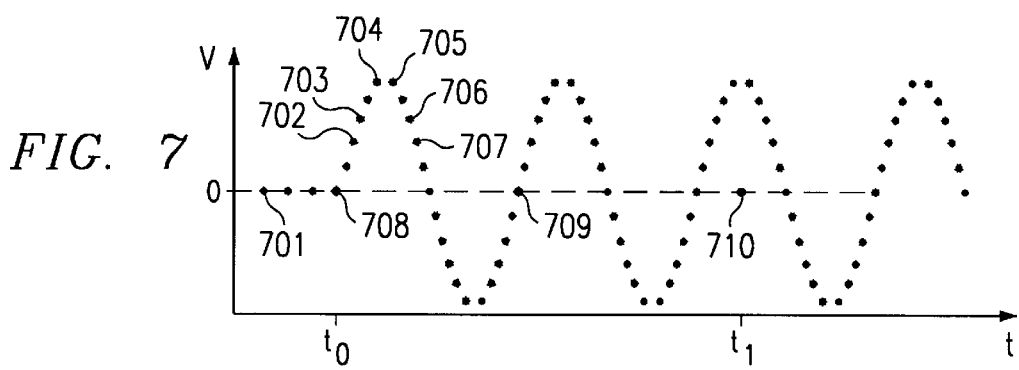
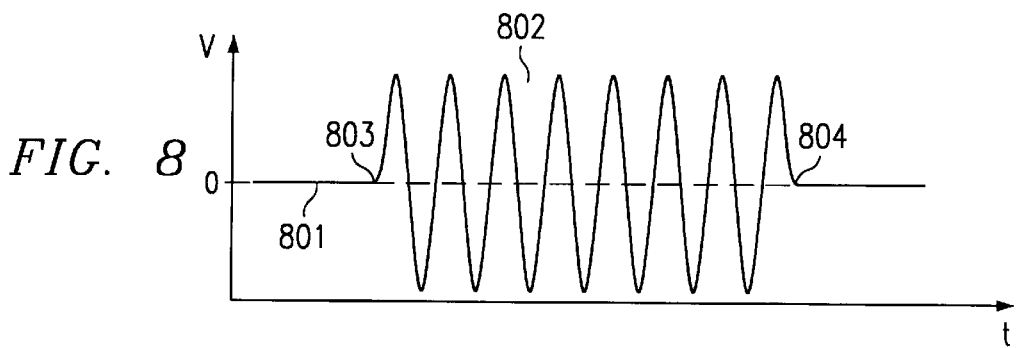

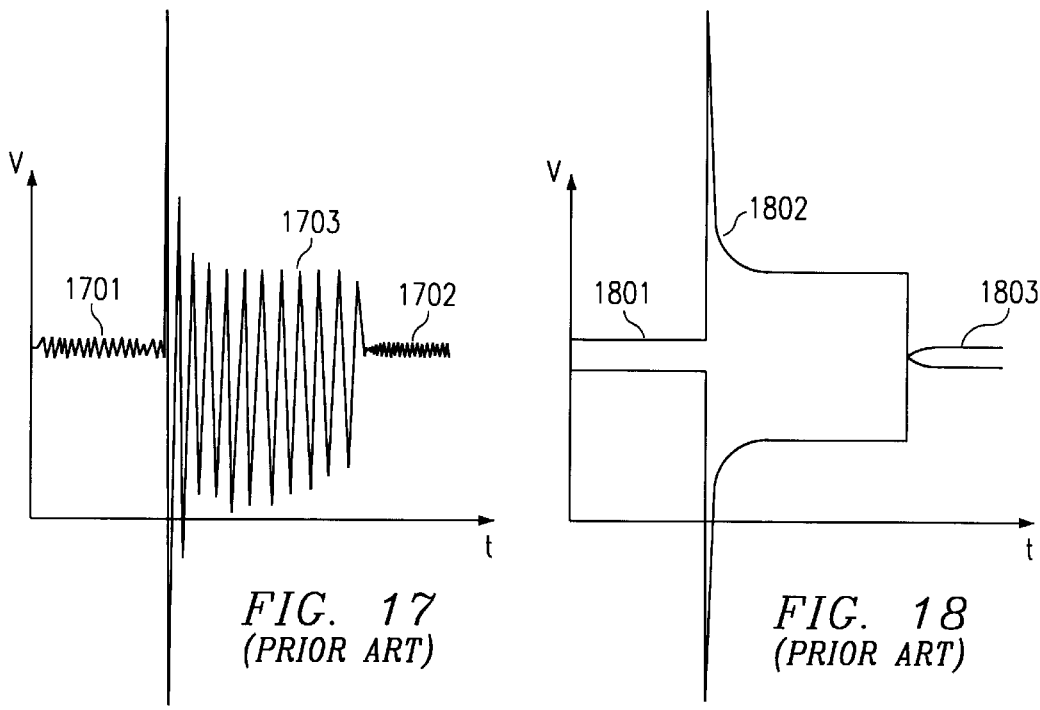
FIG. 17
(PRIOR ART)
FIG. 18
(PRIOR ART)
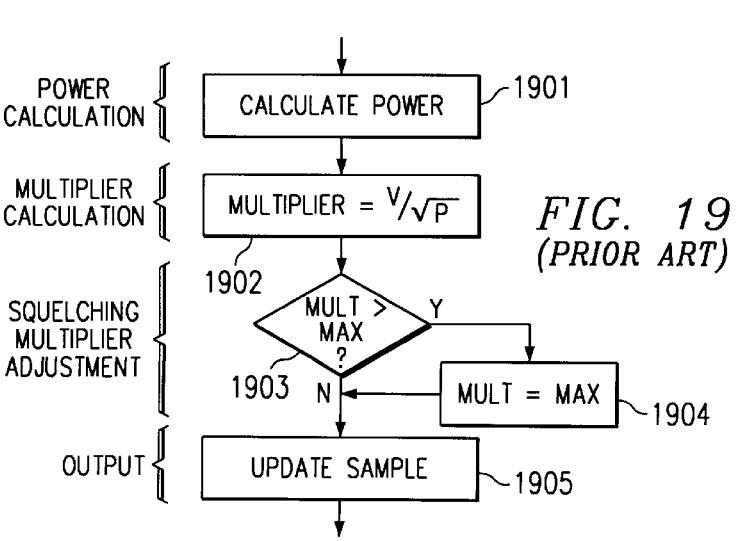
FIG. 19
(PRIOR ART)

METHOD AND CIRCUIT FOR VOICE AUTOMATIC GAIN CONTROL

This application is a continuation of application Ser. No. 07/999,018, filed Dec. 31, 1992, abandoned.

TECHNICAL FIELD OF THE INVENTION

This invention relates generally to a method and circuit for providing automatic gain control for a signal representing a voice and, more specifically, for such a method and circuit which discerns periods of speech from periods of nonspeech and adjusts gain accordingly to maximize fidelity.

BACKGROUND OF THE INVENTION

Automatic gain controls, in a general sense, are not new. For years, it has been desired to provide circuity which amplifies or attenuates an input signal of variable power so as to provide an output signal having a substantially constant power. The purpose of the circuit is to provide an output signal which does not contain wide variations in voltage (or power) amplitude. Of course, it is most advantageous to provide automatic gain control circuits, as opposed to manual gain control circuits, due to the dynamic nature of the input signal. In other words, amplitude and power of an input signal may vary widely in a short period of time. Hence, only by controlling gain dynamically and automatically does one achieve the desired result.

There are two general techniques for providing automatic gain control. The first is a feed forward technique, wherein the input signal is used to derive a gain factor (that amount of that gain which, when multiplied with the input signal, will produce an output signal having a substantially constant power). Once the gain factor has been determined, it is then multiplied with the input signal in a manner which is well known in the art to produce the desired, relatively constant power output signal.

Another technique for providing automatic gain control is the feedback technique. In the feedback technique, the output signal is used to determine the correct gain factor with which to multiply the input signal to provide an output signal having constant power.

These two techniques, feed forward and feedback, provide alternative environments within which methods for automatic gain control operate.

Prior art schemes for providing automatic gain control will be discussed at a later time in conjunction with drawings which effectively illustrate the function of those schemes. In general, these schemes fell in two categories: raw gain control and gain control with squelch.

Even with squelch, these schemes utterly failed in their attempt to provide an automatic gain control which could discriminate between silence and non-silence and compensate for each without distorting either.

The present invention is the first to provide an automatic gain control method and circuit which provides a clear output signal and which is particularly adept at processing audio signals carrying spoken words, the signals characterized by periods of silence between the words.

SUMMARY OF THE INVENTION

It is therefore a primary object of the present invention to provide, in a system for automatically controlling signal gain embodying a process of calculating an initial gain factor from a source signal, a method of minimizing distortion due to widely varying signal levels, comprising the step of gradually varying the initial gain factor to within a preselected band of allowable values when the source signal is above a preselected minimum level and the initial gain factor is above the preselected band.

A further primary object of the present invention is to provide, in a system for automatically controlling signal gain, the system having circuitry and software for calculating an initial gain factor from a source signal, a circuit for minimizing distortion due to widely varying signal level comprising circuitry and software for gradually varying the initial gain factor to within a preselected band of allowable values when the source signal is above a preselected minimum level and the initial gain factor is above the preselected band.

Another object of the present invention is to provide a method of minimizing distortion wherein a source signal is periodically sampled to detect instantaneous power levels at particular times.

A further object of the present invention is to provide a method of minimizing distortion wherein a windowed average power level at a particular point in time is calculated by averaging a predetermined number of instantaneous power levels detected during a predetermined period of time.

Yet another object of the present invention is to provide a method of minimizing distortion wherein a particular point in time occurs at a beginning of a predetermined period of time.

Yet another object of the present invention is to provide a method of minimizing distortion wherein a particular point in time occurs at a midpoint in a predetermined period of time.

Still another object of the present invention is to provide a method of minimizing distortion wherein a particular point in time occurs at an end of a predetermined period of time.

Still a further object of the present invention is to provide a method of minimizing distortion wherein an initial gain factor is a function of a windowed average power level.

Yet another object of the present invention is to provide a method of minimizing distortion wherein an input signal functions as a source signal.

Still yet another object of the present invention is to provide a method of minimizing distortion wherein an output signal functions as a source signal.

Yet a further object of the present invention is to provide a method of minimizing distortion wherein a gradually varying initial gain factor changes within a preselected band at a preselected rate.

Another object of the present invention is to provide a method of minimizing distortion wherein a preselected rate varies over time.

A further object of the present invention is to provide a method of minimizing distortion wherein a preselected rate changes as a function of a rate at which an initial gain factor varies.

Still a further object of the present invention is to provide a method of minimizing distortion wherein a preselected rate changes as a function of a value of an initial gain factor.

Yet a further object of the present invention is to provide a method of minimizing distortion wherein a lower limit of a preselected band is zero gain.

And yet another object of the present invention is to provide a method of minimizing distortion wherein a lower limit of a preselected bank is unitary gain.

In the attainment of the foregoing objects, the preferred embodiment of the present invention is a method of controlling signal gain, comprising the steps of: (1) calculating an initial gain factor from a source signal; (2) setting the initial gain factor equal to a lower limit of a preselected band of allowable values when the source signal is below a preselected minimum level, the step of setting producing thereby a modified gain factor; (3) constraining the initial gain factor to within the preselected band when the source signal is above the preselected minimum level and the initial gain factor is above the preselected band, the step of constraining producing thereby said modified gain factor; (4) setting the modified gain factor equal to the initial gain factor when the initial gain factor is within or below the preselected band; and (5) multiplying an input signal of variable power by the modified gain factor to produce an output signal of a preselected, substantially constant power.

A further preferred embodiment of the present invention is a circuit for automatically controlling signal gain, comprising: (1) circuitry and software for calculating an initial gain factor from a source signal; (2) circuitry and software for setting the initial gain factor equal to a lower limit of a preselected band of allowable values when the source signal is below a preselected minimum level, the setting circuitry and software producing thereby a modified gain factor; (3) circuitry and software for constraining the initial gain factor to within the preselected band when the source signal is above the preselected minimum level and the initial gain factor is above the preselected band, the constraining circuitry and software producing thereby the modified gain factor; (4) circuitry and software for setting the modified gain factor equal to the initial gain factor when the initial gain factor is within or below the preselected band; and (5) circuitry and software for multiplying an input signal of variable power by the modified gain factor to produce an output signal of the selected, substantially constant power.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 illustrates a typical analog speech signal;

FIG. 6 illustrates a digitized version of the analog speech signal of FIG. 5;

FIG. 7 illustrates derivation of a windowed average power level from the digitized signal of FIG. 6;

FIG. 8 illustrates a typical input signal;

FIG. 17 illustrates a prior art output signal as processed by the gain factor curve of FIG. 15;

FIG. 18 illustrates a prior art envelope for the output signal of FIG. 17;

FIG. 19 illustrates a prior art flow diagram for an algorithm embodying the prior art gain control method described in FIGS. 15–18;

DETAILED DESCRIPTION OF THE INVENTION

Figure 1:
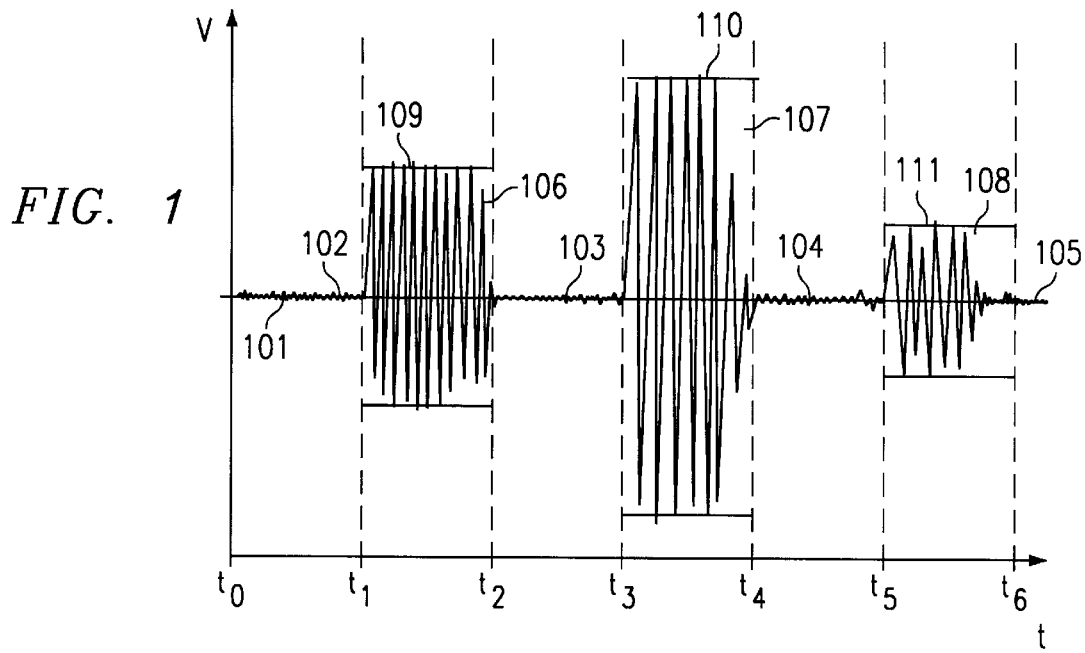
FIG. 1 is a graphical representation of an unmodified speech signal.

Turning now to FIG. 1, shown is a typical unprocessed speech signal, or input signal, generally designated 101. The signal 101 is an analog waveform and comprises periods of silence 102, 103, 104, 105 punctuated by occasional periods of nonsilence 106, 107, 108 which, in the example presented in FIG. 1, represent individual words or continuous phrases as spoken in human voice. Since the signal 101 is presented in voltage as a function of time, periods of silence 102, 103, 104, 105 are characterized by relatively low voltage amplitude, whereas periods of nonsilence 106, 107, 108, representing speech, are shown as having a substantially greater amplitude. (Since current is constant in such signals, power is a direct function of voltage.) However, it is important to note that the periods of nonsilence 106, 107, 108 are, themselves, of widely differing average amplitude. For instance, the period of nonsilence 106 has an average maximum amplitude 109. Periods of nonsilence 107 and 108 have average maximum amplitudes 110 and 111, respectively. These average maximum amplitudes 109, 110, 111 are variable, depending upon the exigencies of human speech.

However, it is undesirable to have a speech signal having different average maximum amplitudes for each spoken word. Perhaps, in the example shown in FIG. 1, the portion of nonsilence 108 may not be nearly as audible as that portion of nonsilence 107. Conversely, however, the portion of nonsilence 107 may be deemed to be too loud and may overstress sound-reproducing components, such as speakers.

One purpose of an automatic gain control ("AGC") is to minimize variation in average maximum amplitudes, to thereby provide, particularly with respect to speech, an output wave form which contains periods of nonsilence that are substantially similar in terms of average maximum amplitude. Another purpose of some AGCs is to attenuate "silence." Some AGCs aren't concerned at all about the "silence" regions, they are used for signals other than speech.

Figure 2:
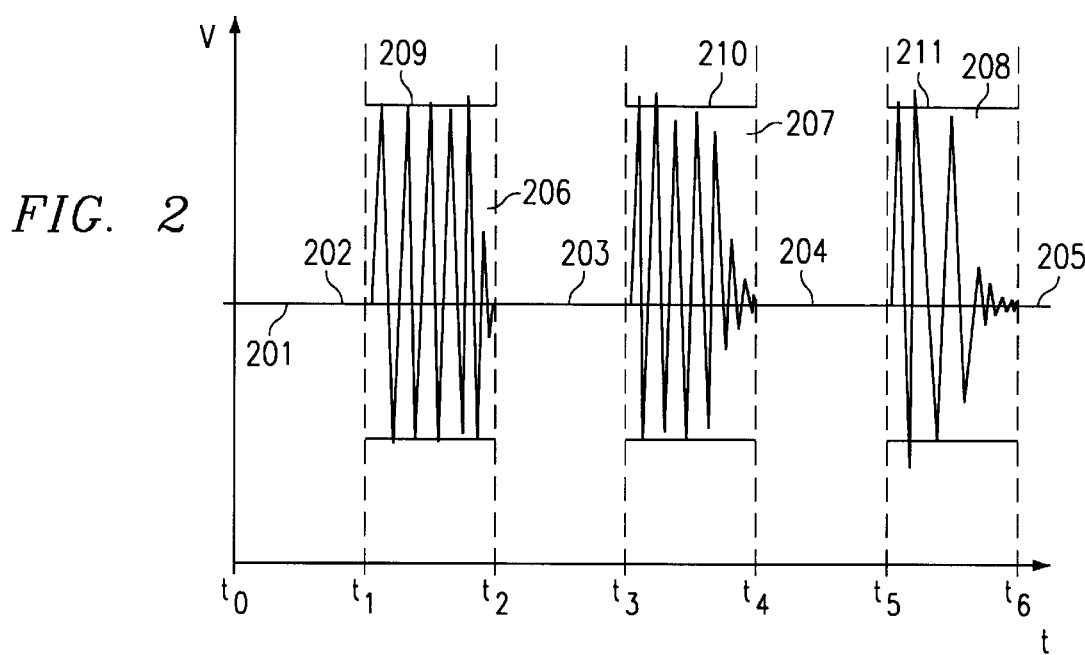
FIG. 2 is a graphical representation of the signal of FIG. 1 as processed by an ideal automatic gain control circuit.

Turning now to FIG. 2, shown is signal 101 of FIG. 1 as processed by an ideal AGC. Note that the idealized output signal of FIG. 2, generally designated 201 comprises periods of silence 202, 203, 204, 205, as before. The signal 201 further comprises periods of nonsilence 206, 207, 208. However, the periods of nonsilence 206, 207, 208 have substantially similar average maximum amplitudes 209, 210, 211. Obviously, periods of nonsilence 206, 207, 208 may be generated from corresponding periods of nonsilence 106, 107, 108 by application of gain factors to each of the periods of nonsilence 106, 107, 108. These gain factors, which are different for each of the periods of nonsilence 106, 107, 108 are multiplied by the signals during the periods of nonsilence 106, 107, 108 to result in the modified periods of nonsilence 206, 207, 208. In the specific example in FIG. 2, period of nonsilence 106 has been multiplied by a gain factor slightly greater than unitary value to result in period of nonsilence 206. Period of nonsilence 107 has been multiplied by a gain factor less than unitary value to result in period of nonsilence 207. Finally, period of nonsilence 108 has been multiplied by a gain factor larger than that used in conjunction with period of nonsilence 106 to result in period of nonsilence 208, because period of nonsilence 108 has an average maximum amplitude less than that of period of nonsilence 106, as shown in FIG. 1.

However, there is another very important aspect of the idealized output signal 201 of FIG. 2. The periods of silence 202, 203, 204, 205 have, in the idealized output signal 201, no amplitude. This differs substantially from the input signal 101 of FIG. 1. An ideal AGC should be able to discern silence from nonsilence and, should attenuate silence to zero, while amplifying or attenuating periods of nonsilence to certain, relatively constant desired levels.

Unfortunately, as described in the background of the invention, ideal AGCs are nonexistent. A primary reason for the nonexistence of ideal AGCs is the very nature of the analysis which they are required to undertake. Specifically, it is normally a simple task for a person to examine input signal 101 and determine which portions of input signal 101 represent silence and which portions represent nonsilence. However, an AGC operating in a real environment does not have the advantage of examining the entire signal at once. Rather, because an AGC must operate in real-time, the AGC must analyze the signal as it is received, one piece or sample at a time. Therefore, at a particular point in time, an input signal received by the AGC may increase momentarily in voltage. However, the AGC does not have the benefit of being able to tell whether the increase in voltage is merely "the sound of silence" or an approaching period of nonsilence. The AGC, therefore, must take a "best guess" as to what lies in the future. Due to this exigency of real-time analysis, AGCs have a reaction time, much as do human beings. Therefore, it is of primary significance in designing an AGC to provide the AGC with an ability to guess, as well as possible, as to what will happen next vis-a-vis the signal and, in response to that guess, react as quickly as possible. However, this consideration must be tempered with a countervailing consideration: the AGC must not be too quick to judge, for even if the guess is correct, the signal might be distorted, because some of the "voice" information is included in the amplitude variations themselves, it will risk grossly distorting the output signal, thereby significantly degrading its fidelity to the input signal. It is with these considerations in mind that the AGC of the present invention was designed.

An AGC method or circuit is implemented within the frame work of well-known control strategies. As discussed previously, there are two such methods for implementing AGC.

Figure 3:
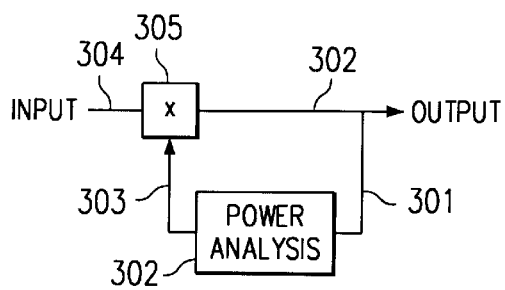
FIG. 3 illustrates a feedback gain control circuit.

Turning now to FIG. 3, shown is a feedback method. Feedback control is accomplished by coupling, either directly or inductively, a sensor line 301 to an output line 302. The sensor line 301 senses, for example, voltage of a signal existing on the output line 302, and transmits that voltage to a power analysis circuit 302, which performs gain and compensation calculation, resulting in an output signal delivered on line 303 which, when added or multiplied with an input signal on input line 304 results in the output signal on output line 302. Combination, in the preferred embodiment of the invention, is accomplished by multiplication and is performed in a multiplier 305.

Figure 4:
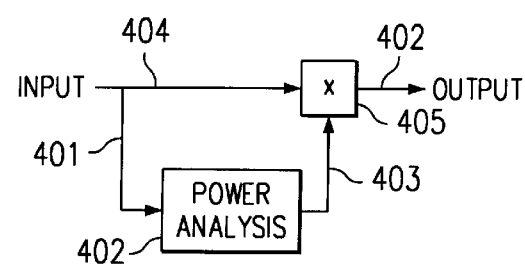
FIG. 4 illustrates a feed forward gain control circuit.

Turning now to FIG. 4, shown is a feed forward method or circuit. The circuit comprises a sensor line 401, which samples an input signal existing on input line 404. Power analysis circuitry 402 develops a gain and compensation signal 403 from the voltage sensed on line 401. The gain and compensation signal is combined by a multiplier 405 with the input signal on input line 404 and delivered on an output line 402.

The merits of feedback versus feed forward gain control will not be discussed here, as it is outside the scope of a discussion of the present invention. However, the present invention can operate in conjunction with either of these controls.

Turning now to FIG. 5, shown is a typical analog signal or input signal, generally designated 501. This typical analog signal 501 will be used throughout the remainder of this description as a basis for illustration of the various methods of automatic gain control. It is important to note that the signal 501 has a first period of silence 502, a second period of silence 503 and a period of nonsilence 504, representing a single spoken word.

Turning now to FIG. 6, shown is a digital signal 601, which is a digitized version of the analog signal 501 of FIG. 5. In contrast with the analog signal 501, the digital signal 601 comprises a plurality of points, representing a plurality of voltage (or, as explained earlier, power) samples, taken at periodic times. The samples, when plotted as in FIG. 6, form a dotted-line representation of the analog signal 501 of FIG. 5. However, since the best mode for practicing the present invention operates in the digital domain as a digital signal processor, it is important to note that the best mode of the present invention deals with signals as a collection of digital samples as represented by signals 601, and not as an analog signal, such as signal 501, although an analog AGC operating on an analog signal is well within the scope of the present invention. It should also be noted that succeeding figures will appear as continuous waveforms, although they are, in fact, collections of digital samples.

Turning now to FIG. 7, shown is a digital signal 701, again, comprising a plurality of voltage or power samples. Because of wide fluctuations in signal amplitude from one point to the next, it is important for the AGC not to draw conclusions too quickly as to the trend of a particular portion of the signal 701. For instance, were the AGC to examine voltage differences between a single pair of samples, say samples 702 and 703, the AGC would be misled into believing that the signal were trending toward a steep rise. In sharp contrast, sampling as between samples 704 and 705 or as between samples 706 and 707 would each result in drastically different conclusions. Therefore, it is important that the AGC make its decision based on long-term, average trends. Accordingly, the AGC of the present invention, as well as AGCs of the prior art, looks at a windowed average voltage or power level to thereby even out short-term transitions. Accordingly, shown in FIG. 7 are times $T_0$ and $T_1$, between which are a plurality of samples. An AGC may develop an average for a particular point in time based on an average of the values of these samples within the times $T_0$ and $T_1$. This average can be taken linearly, or geometrically or by any other valid averaging method but is, in either event, termed "square windowing" because each sample within a window is of equal importance or weight. Once an average for the samples between $T_0$ and $T_1$ has been developed, it becomes important to ascribe that average to a particular point in time. Typically, that point in time is alternatively chosen as: (a) that point in time occurring at $T_0$, as evidenced by point 703, (b) at a bisecting midpoint between $T_0$ and $T_1$, evidenced by point 709 or (c) that point in time occurring at $T_1$, evidenced by point 710. However, these are merely conventions, and nothing would keep one from selecting another point in time to which to ascribe the windowed average power or voltage values taken between times $T_0$ and $T_1$.

Turning now to FIG. 8, shown is an input signal 801 which begins a period of nonsilence 802 at a point 803 and ends that period of nonsilence 802 at a point 804.

Figure 9:
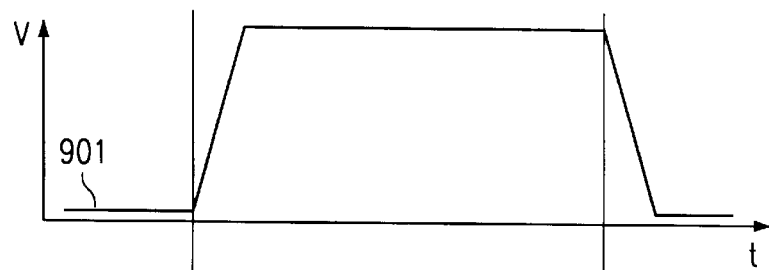
FIG. 9 illustrates windowed average power levels for the signal of FIG. 8 when a particular point is assumed to be at an end of a square window.

Turning now to FIG. 9, shown is a curve 901 of windowed average times resulting from taking square window averages of samples of the signal 801 of FIG. 8 and applying each square window average to an end point of the window. This is accomplished via application of the following equation:

$$P(n) = \sum_{i=n-k}^{i=n+k} x^2(i)$$

where k is one-half of the window size, x is the sampled value and n is the point to which the average is applied. This would be analogous to choosing point 710 of FIG. 7. As can be seen, because an end point is chosen, the curve 901 lags the signal 801 in time.

Figure 10:
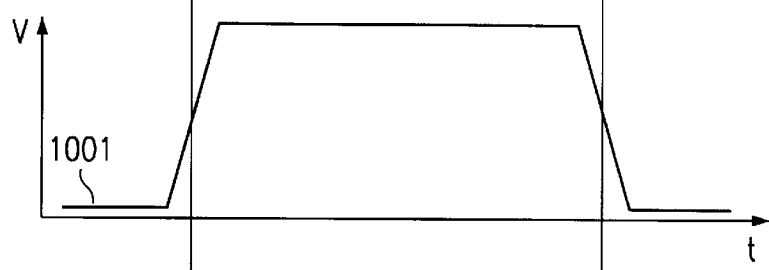
FIG. 10 illustrates windowed average power levels for the signal of FIG. 8 when a particular point is assumed to be at a midpoint of a square window.

Turning now to FIG. 10, shown is a curve 1001 which results when selecting a midpoint, analogous to choosing point 709 of FIG. 7. Notice that, because a midpoint has been chosen, the curve 1001 is symmetrical about points 803 and 804 of FIG. 8.

Figure 11:
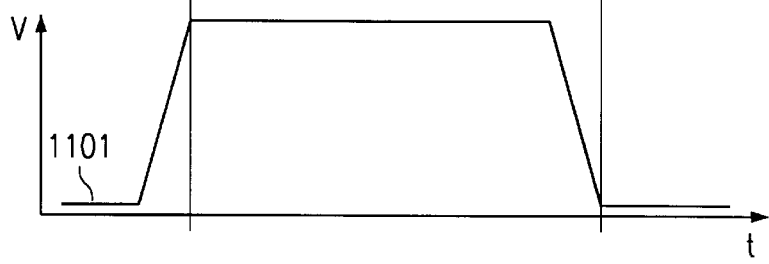
FIG. 11 illustrates windowed average power levels for the signal of FIG. 8 when a particular point is assumed to be at a beginning of a square window.

Finally, shown in FIG. 11 is a curve 1101, resulting from choosing a beginning point of each window, corresponding to a selection of point 708 in FIG. 7. Notice that the curve 1101 leads the wave form 801 due to this choice.

Actually, the choice of a beginning point, midpoint or endpoint is rather insignificant in determining the quality of output from AGC. However, it is important to choose a single point to which to ascribe square window averages.

Figure 12:
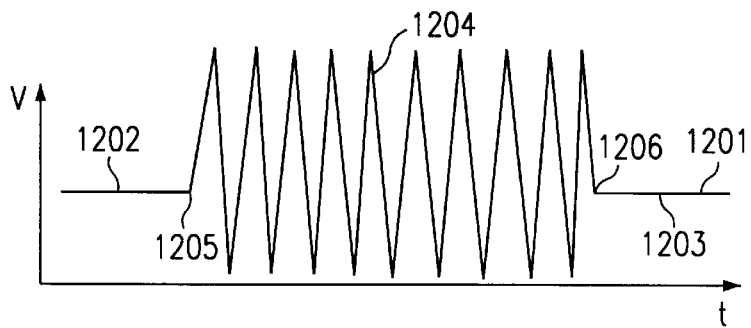
FIG. 12 illustrates a typical analog speech signal averaged by an exponential window.

Turning now to FIG. 12, shown is an alternative method for developing a time-averaged value to ascribe to a single point in time using an exponential window. Specifically, shown is a signal 1201, having periods of silence 1202, 1203, punctuated by a period of nonsilence 1204 having a beginning point 1205 and an ending point 1206. A time-averaged value may be developed for a particular point in time by taking the time-averaged value previously developed for the preceding point in time, multiplying a weighting factor by that value (alpha) and averaging that value with the value sensed for the particular point. This is accomplished via application of the following equation:

$$P(n) = \alpha P(n-1) + x^2(n)$$

where α is the weighting factor, x is the sampled value and n is the point to which the average is applied. Therefore, the calculated average for any point in time is determined, in part, by the average calculated for the previous point in time. However, because of the alpha weighting factor, the previous point in time is diminished in significance. Alpha is set equal to a value between zero and one. If alpha is a relatively high number (i.e., close to one), prior calculated averages will have a greater significance in the calculation of an average for a current point, thereby stabilizing the calculation of averages for points. However, if alpha is chosen to be small (closer to zero), calculation of averages becomes less stable, allowing for faster response to variations in actual signal level.

Figure 13:
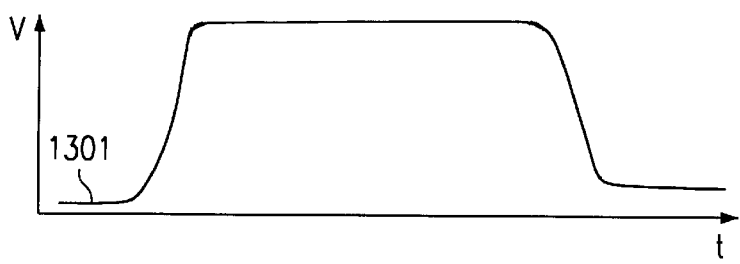
FIG. 13 illustrates an average power curve for the analog signal of FIG. 12 averaged by an exponential window.

Turning now to FIG. 13, shown is a curve 1301 which has been derived by calculating averages from exponential windows for points along the signal 1201 of FIG. 12. The advantages or disadvantages attendant to choosing either square window averages or exponential window averages are beyond the scope of this discussion. However, the best mode of the present invention contemplates use of exponential window averages, such as detailed in FIG. 7, because that technique requires less computer memory.

As mentioned before, the purpose of the AGC of the present invention is to develop a gain and compensation signal which, when multiplied with an input signal produces an output signal having the desired characteristics of discernment of silence from nonsilence and relatively constant power nonsilence output.

Figure 14:
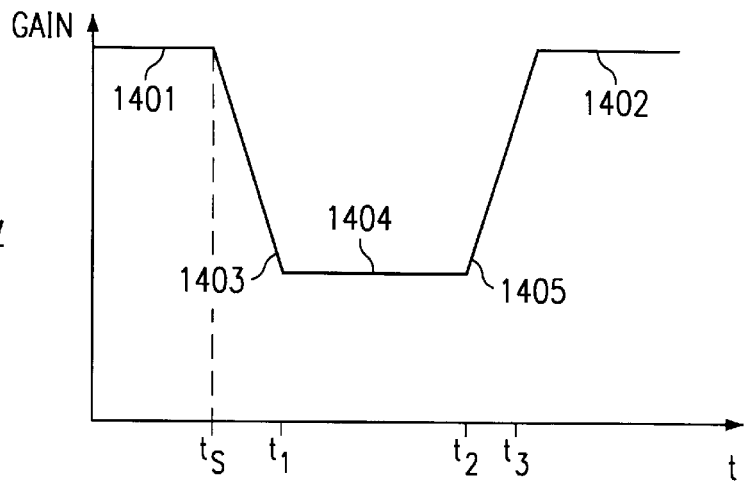
FIG. 14 illustrates an initial gain factor curve.

Accordingly, turning now to FIG. 14, shown is a plotted curve of an initial gain factor which, when applied to an input signal, such as that detailed in the exemplary input signal 501 of FIG. 5, produces an output signal of relatively constant power. Accordingly, during periods of silence, when amplitude is very low, a very large gain factor must be applied to the silence to produce a desired output level. Accordingly, in the curve shown in FIG. 14, a region 1401 of extremely high gain corresponds to the period of silence 502. This gain is inversely proportional to the noise level during the "silence" region. Similarly, a second region of extremely high gain 1402 corresponds to the period of silence 503. As the signal 501 of FIG. 5 increases in windowed average maximum amplitude, thereby indicating the presence of nonsilence, or speech, the automatic gain control, via examination of windowed averages, determines a need to decrease the gain factor. Accordingly, there is a region 1403 wherein the gain factor decreases. This decrease is not sudden, because of the windowed average effect. In other words, although signal 501 of FIG. 5 has increased instantaneously, period 1403, occurring between times $T_0$ and $T_1$ sees only a gradual decrease of the gain factor.

In that period of time between times $T_1$ and $T_2$, the period of nonsilence, or speech, maintains the windowed average level at a constant high, allowing the AGC to apply the appropriate gain factor to result in a proper output amplitude. This is evidenced in region 1404. In region 1405, occurring between $T_2$ and $T_3$, the period of silence 503 takes place in signal 501 of FIG. 5. Accordingly, the windowed average imposes a delay on recovery of the gain factor to its original, extremely high level, corresponding to compensation for silence, occurring in period 1402. It is apparent from the curve shown in FIG. 14 that a grave problem has arisen.

Specifically, during periods of silence, the gain factor has been adjusted so as to greatly amplify noise level in the "silence" region." In other words, the silence has been made to be as loud as the nonsilence, or speech. This is highly undesirable.

Accordingly, one prior art technique for solving this problem is to determine an arbitrary level, say −60 decibels (dBm), and designate that to be the threshold between silence and nonsilence. Accordingly, when the windowed average at a particular point in time indicates a power level of less than −60 dBm, prior art AGCs limited the gain factor to a certain preselected maximum. This is evidenced in FIG. 15 by limits occurring in regions 1501 and 1502. When the input signal is seen to rise above −60 dBm, prior art AGCs responded by allowing the gain factor to act as before and drop below the maximum, so as not to overamplify the signal. This is evident between times $T_0$ and $T_3$.

Figure 15:
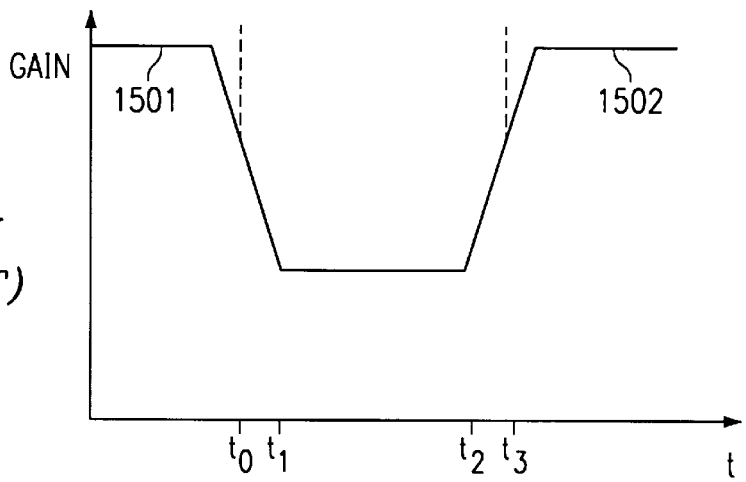
FIG. 15 illustrates an initial gain factor curve using a simple prior art squelching technique.
Figure 16:
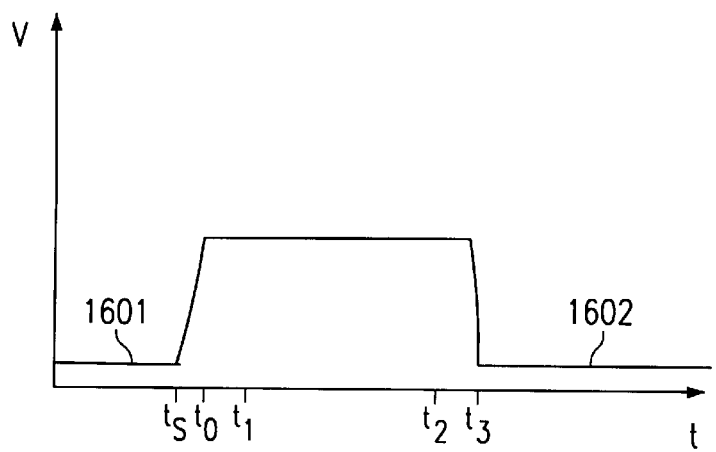
FIG. 16 illustrates a prior art windowed average input signal.

When the gain factor as shown in FIG. 15 is applied to the windowed average power of the signal as shown, for example, in FIG. 10, the curve of FIG. 16 results. Note that regions 1601 and 1602 are nonzero in value.

Turning now to FIG. 17, shown is a signal resulting when the curve of FIG. 16 is applied to input signal 501 of FIG. 5. Unfortunately, due to the inability of the prior art AGC to properly compensate for periods of silence, the envelope and signal of FIG. 17 show significant distortion due to action of the AGC. Specifically, periods of "silence" 1701, 1702 have been emphasized, while the period of nonsilence (speech) 1703 has been distorted to overemphasize its attack. In the sense that "Peter has been robbed to pay Paul," note that the period of "silence" 1702 is diminished at its beginning.

This is particularly evident in a plot of the envelope of the signal shown in FIG. 17 as shown in FIG. 18. Note that there are two distinct areas of distortion. First, there is an overemphasis of "silence," as shown during period 1801. Furthermore, there is distortion by overamplification of the period of speech, occurring in region 1802. The technique which causes this overamplification also causes an underamplification of "silence" at period 1803. This small advantage is short-lived, because the "silence" soon returns to quite audible levels.

Turning now to FIG. 19, shown is a flow diagram of the method used in prior art AGCs. Specifically, the power of a source signal is calculated in block 1901, a multiplier or gain factor is derived from that power in block 1902. If that multiplier or gain factor is greater than a certain desired maximum, as decided in block 1903, the multiplier is held to the maximum in block 1904. If, on the other hand, the multiplier is less than the desired maximum, no limiting action is taken. In either event a new digital sample is taken in a block 1905 so as to allow the method to calculate a more recent power.

Figure 20:
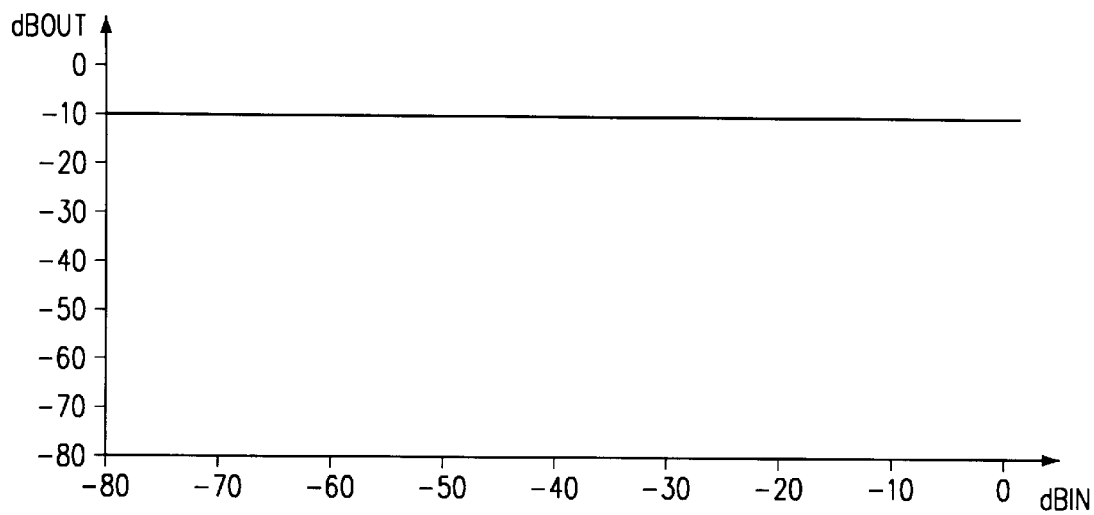
FIG. 20 illustrates a gain curve for an automatic gain control without squelch.

Turning now to FIG. 20 shown is a plot of gain, specifically output signal strength versus input signal strength, each expressed in dBm. In the crudest form of prior art AGC, no matter what the input signal is, the output signal is adjusted to have a constant strength. This is reflected by the curve in FIG. 20.

Figure 21:
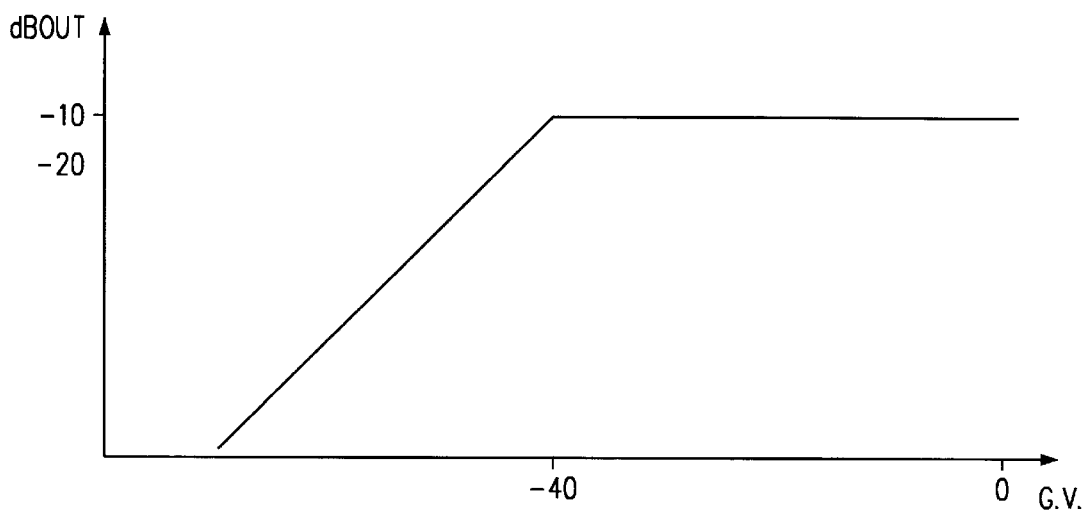
FIG. 21 illustrates a modified gain factor curve for an automatic gain control employing the prior art squelching technique described in FIGS. 15–19.

Turning now to FIG. 21, shown is the effect of crude squelching, as performed by some prior art AGCs. Output is held constant until the level of the input signal drops below a certain level, at which point the output signal level is allowed to drop below the usual maximum. This corresponds to the periods of "silence" 1701 and 1702 of FIG. 17.

Figure 22:
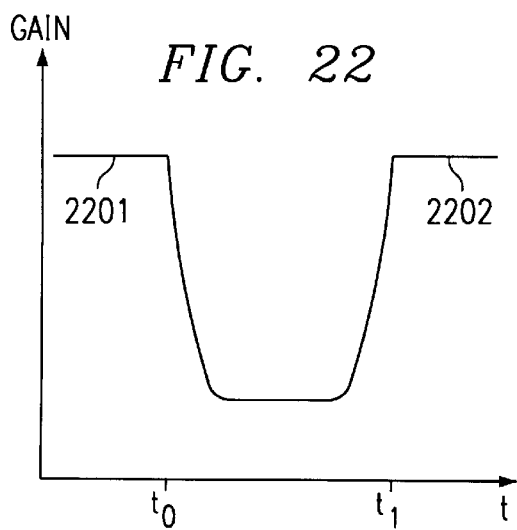
FIG. 22 illustrates an initial gain factor curve for an embodiment of the present invention.

Turning now to FIG. 22, shown is an initial gain factor curve having, as before, portions where the gain factor has been raised substantially to compensate for periods of silence. These portions are designated 2201 and 2202.

Figure 23:
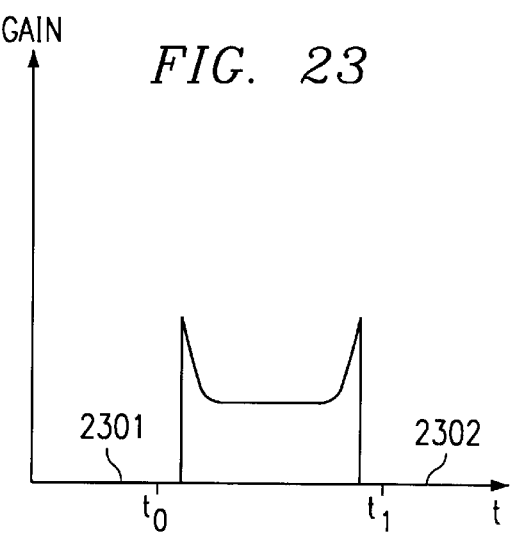
FIG. 23 illustrates a modified gain factor curve with squelch of the present invention.

Turning now to FIG. 23, shown is one embodiment of the present invention wherein the input signal is squelched during periods of silence. However, in contrast to the squelching method of the prior art, the squelching method disclosed in FIG. 23 involves setting the gain factor equal to zero when the input signal is below a certain minimum power, i.e., "silence," to produce thereby a modified gain factor. As can be seen in FIG. 23, the modified gain factor curve shown has periods 2301, 2302 wherein the gain factor is zero. When the input signal reaches a certain predetermined minimum level, the modified gain factor is allowed to return to the point at which it needs to be to establish an output signal having relatively constant power, as shown. However, the transition between the gain factor in squelch mode and nonsquelch mode is abrupt, i.e. "bang-bang" in nature. More will be said about this later.

Figure 24:
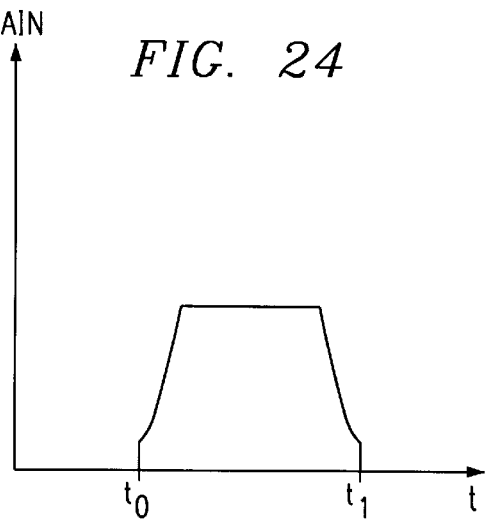
FIG. 24 illustrates an average power curve of the embodiment of the present invention described in FIGS. 22 and 23.

Turning now to FIG. 24, shown is an average power curve for the input signal following processing using the modified gain factor curve of FIG. 23. Briefly, it should be noted that, prior to $T_0$ and following $T_1$, power is zero. This is due to the absolute squelching of periods of silence and the input signal. Notice, however, that when the average power curve shown in FIG. 24 starts, it is abrupt. Likewise, it ends abruptly.

Figure 25:
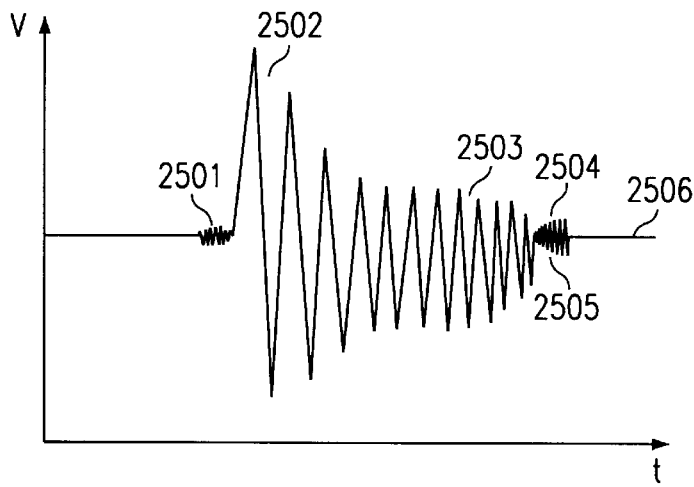
FIG. 25 illustrates an output signal and envelope as processed by the gain control method described in FIGS. 22–24.

Turning now to FIG. 25, shown is the input signal 501 of FIG. 5 as processed by an AGC operating under an embodiment of the invention described in FIGS. 22–24. Due to the fact that the point for which a windowed average power is calculated is in the middle of the window, there exists a short period of "silence" 2501 which has not been entirely squelched. Also, when the signal 501 of FIG. 5 transitions from silence to nonsilence (speech), the resulting output signal is overamplified, demonstrated in region 2502. As the "speech" portion of the signal 501 continues, the modified gain factor applied to it comes back into line, shown by point 2503. Finally, when the period of silence following the speech occurs, gain is initially proper (viz. point 2504). However, this moment of brief silence is followed by an overamplification of "silence" (at point 2505) for a brief instant until the AGC detects that, in fact, the input signal is "silent." At this point, the AGC reacts by setting the gain factor equal to zero, hence region 2506. These brief periods of noise before and after the period of speech are called "sidelobes" or "lobes."

Figure 26:
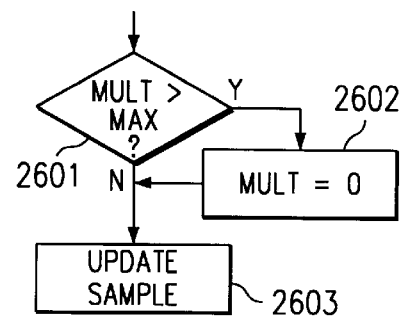
FIG. 26 illustrates a flow diagram of the method described in FIGS. 22–25.

Turning now to FIG. 26, shown is a flow diagram embodying the method described in FIGS. 22–25. Briefly, a decision is made in box 2601 as to whether the "multiplier" or initial gain factor is greater than a predetermined maximum, hence indicating silence. If it is, the multiplier is set equal to zero in box 2602. In either event, the sample is updated in box 2603.

Figure 27:
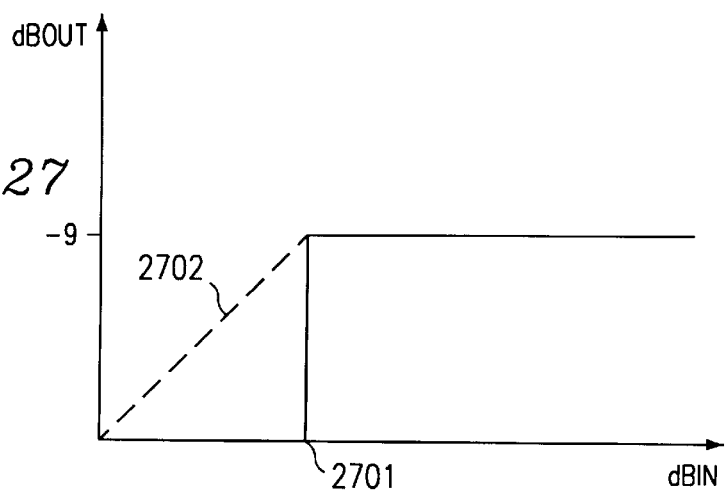
FIG. 27 illustrates a gain curve for the method described in FIGS. 22–26.

Turning now to FIG. 27, shown is a gain curve for the method described in FIGS. 22–26. Briefly, at a threshold level of input 2701, the gain factor is squelched to zero. A dotted line 2702 indicates, for comparison's sake, gain as found in the prior art squelching method.

Turning now to FIG. 28, shown, again, is the initial gain factor curve shown in FIG. 22, comprising gain factor periods 2201, 2202, which correspond to periods of silence in the input signal.

Figure 29:
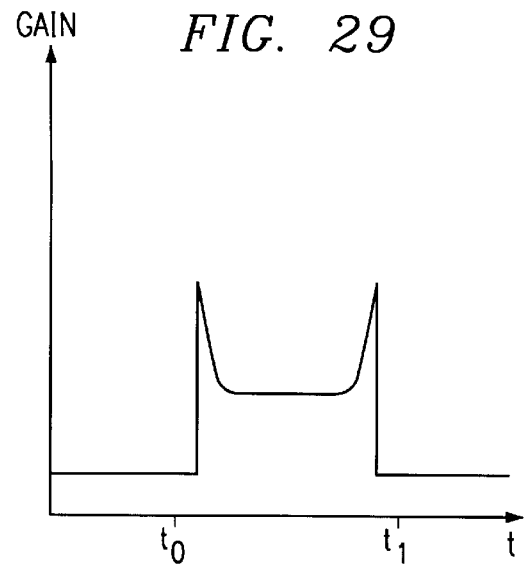
FIG. 29 illustrates the initial gain factor curve of FIG. 28 as modified with a squelching method of the present invention.

Turning now to FIG. 29, shown is an alternative embodiment of the present invention wherein, rather than setting the gain factor equal to zero during determined periods of silence, the gain factor is set to a unitary value, i.e. one. This still results in a "bang-bang" type of transition between periods of silence and speech.

Figure 28:
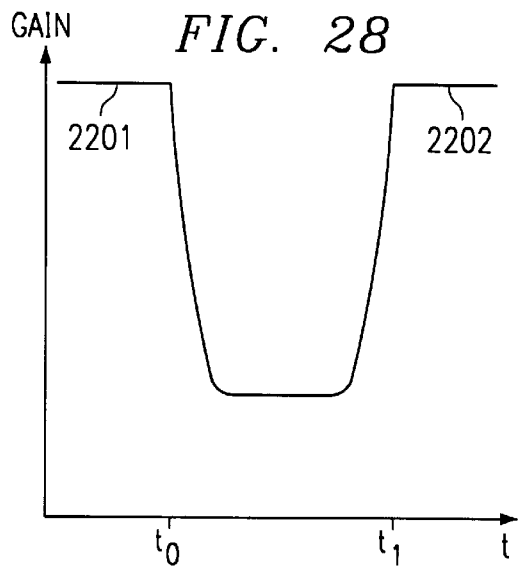
FIG. 28 illustrates an initial gain factor curve.
Figure 30:
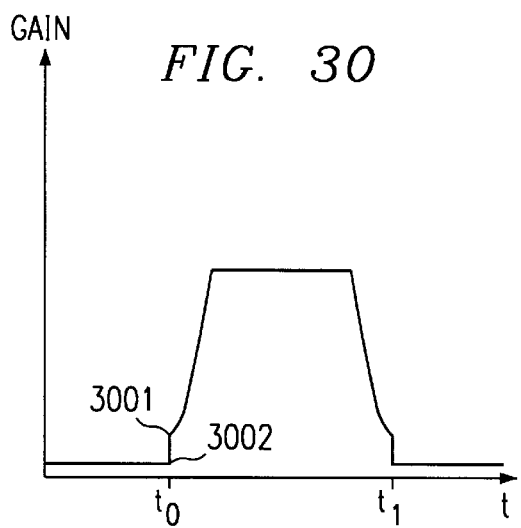
FIG. 30 illustrates an average power curve of the embodiment of the present invention described in FIG. 29.

However, FIG. 30 clearly illustrates why the alternative embodiment illustrated in FIGS. 28 and 29 is perhaps more desirable in certain applications. Briefly, at time $T_0$, there occurs a transition from silence to speech. Before, as evidenced in FIG. 24, this transition was from zero to a point 3001. However, in FIG. 30, this transition is from a point 3002 to point 3001. Quite simply, this is not as great a leap to take, thereby making the transition between silence and speech seem less drastic. The effect is psychological as well as real.

There is a phenomenon which occurs when the human mind encounters a relatively constant stimulus over a long period of time. The mind masks out that stimulus to render it psychologically invisible. Studies have shown that typical office machinery (for instance, typewriters) operating in a perfectly quiet room can seem quite noisy. However, if one places a source of constant low-volume, broad spectrum noise (such as a white-noise generator) in the same room with the typewriters, the noise produced by the typewriters seems to be less irritating. This is because the mind has disposed of the white noise and some of the noise produced by the typewriter along with it, leaving only a portion of the typewriter noise as an irritant.

Figure 31:
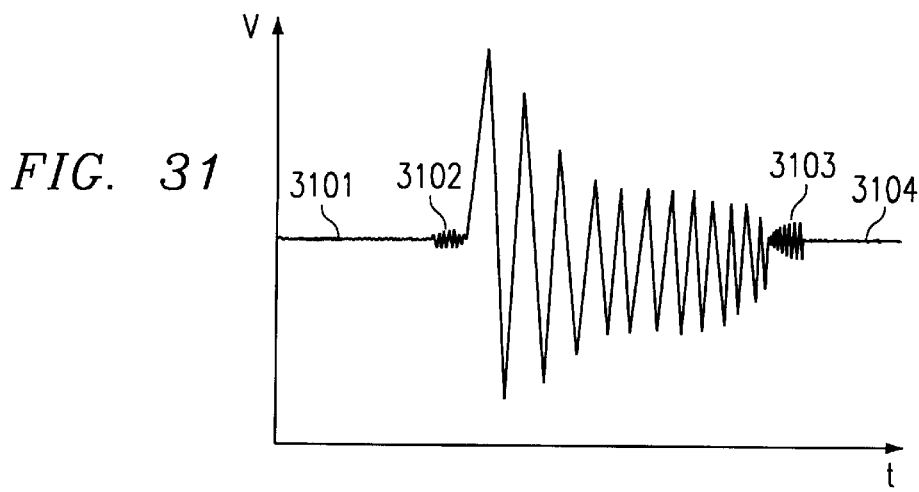
FIG. 31 illustrates an output signal and envelope as processed by the embodiment of the present invention described in FIGS. 28–30.

The effect is the same with speech versus silence. To illustrate this, FIG. 31 shows the input signal 501 of FIG. 5 as processed by an AGC embodying the method described in FIGS. 28–30. The resulting output signal is quite similar to that shown in FIG. 25, having lobes 3102, 3103 of overamplified detectable "silence" both before and after the speech. However, whereas in FIG. 25 these lobes emerged from "nowhere," in FIG. 31 there is some detectable "silence" 3101, 3104 surrounding these lobes to "soften the blow." This diminishes the jarring onset of the lobes and is a very real effect.

Figure 32:
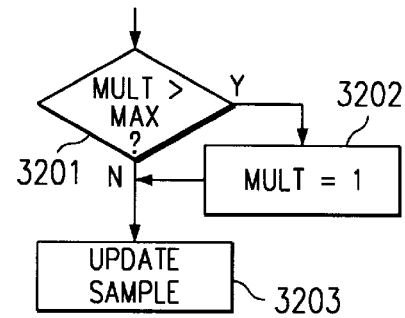
FIG. 32 illustrates a flow diagram of the method described in FIGS. 28–31.

Turning now to FIG. 32, shown is a flow diagram embodying the method taught in FIGS. 28–31. Briefly, as in FIG. 26, it is decided in box 3201 whether or not the multiplier or initial gain factor is greater than a predetermined maximum. If so, the multiplier is set equal to a unitary value or "one" in box 3202. In either event, another sample is taken per box 3203 to allow further processing.

Figure 33:
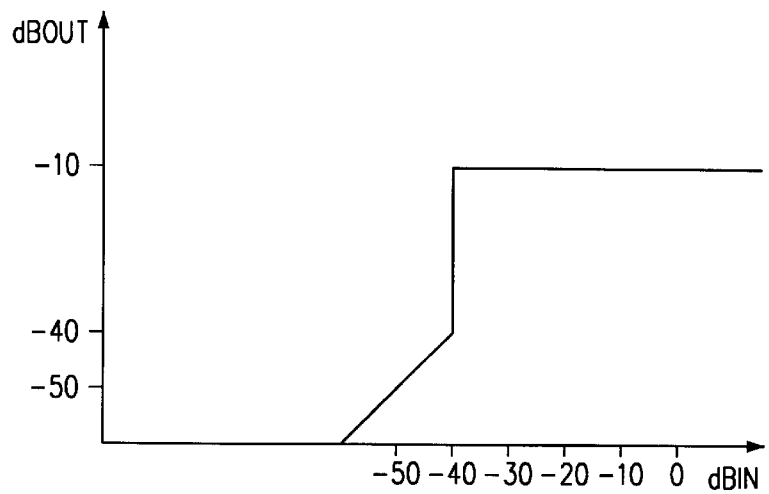
FIG. 33 illustrates a gain curve for the method described in FIGS. 28–32.

Turning now to FIG. 33, shown is a gain curve for the method described in FIGS. 28–32. It is graphically shown in FIG. 33, specifically in region 3301, that application of unitary gain has "softened" the transition from silence to speech, hence the "gentler slope" of region 3301.

Figure 34:
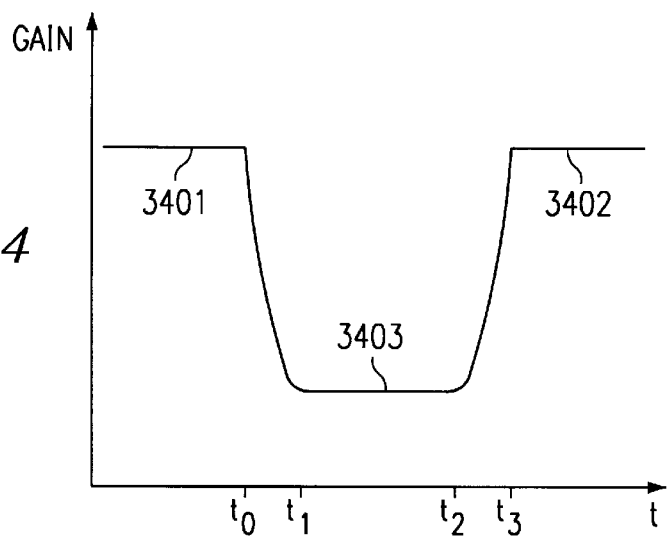
FIG. 34 illustrates an initial gain factor curve.

Turning now to FIG. 34, shown is an initial gain factor curve which is identical to the initial gain factor curves of FIGS. 22 and 28. Again, the curve of FIG. 34 has periods of extremely high gain 3401, 3402, corresponding to periods of input signal silence and intermediate region 3403 of somewhat lower gain factor corresponding to a period of speech.

Figure 35:
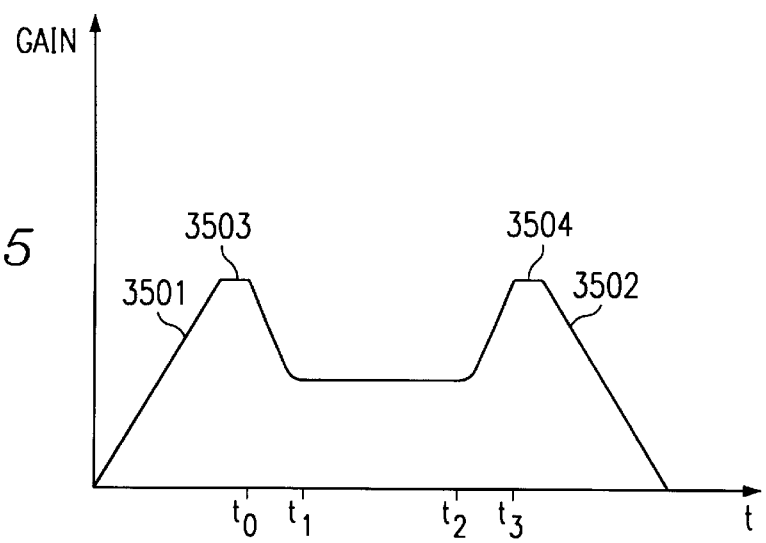
FIG. 35 illustrates the initial gain factor curve of FIG. 34 as modified by an alternative embodiment of the present invention.

Turning now to FIG. 35, shown is a squelching technique which is an alternative embodiment of the present invention and which tackles the transition problem by providing sloped regions 3501, 3502. Quite simply, this provides a "soft start" for introducing speech or silence from the other. In other words, in tracing the curve shown in FIG. 35 from left to right and recalling that, for purposes of FIG. 35, the point for which a windowed average power level is taken occurs at the beginning of the exponential window sampled, as soon as a transition of the input signal above a threshold minimum level is detected (i.e. speech is beginning), the AGC allows the modified gain factor to increase at a certain predetermined rate. This is so even though the windowed average for the point in time may not yet itself exceed the minimum threshold required for determining that speech is, in fact, taking place. If speech does not ultimately occur, then the windowed average will never change enough to cause an unduly large amount of gain to be applied to the period of silence. If, however, a transition to speech is occurring, the modified gain factor will be allowed to rise at a predetermined maximum rate, as shown in region 3501. This rising is allowed to continue until the modified gain factor reaches a predetermined maximum 3503. This predetermined maximum prevents the curve from becoming too great. When the initial gain factor drops below the predetermined maximum 3503, then the modified gain factor is set equal to the initial gain factor. This continues until the initial gain factor again rises above the predetermined maximum at point 3504. At this point 3504, the modified gain factor is held to a maximum until points being sampled at the leading edge of the window indicate a transition to silence, at which point the modified gain factor is allowed to decline at a predetermined maximum rate along region 3502 until the gain reaches zero, or some other predetermined minimum (for instance, unitary gain and as described in previous embodiments of the present invention). As can be clearly seen in FIG. 35, this method allows for soft starts and stops of speech, rather than providing for "bang-bang" transitions as contrasted with the previously described embodiments of the present invention.

Figure 36:
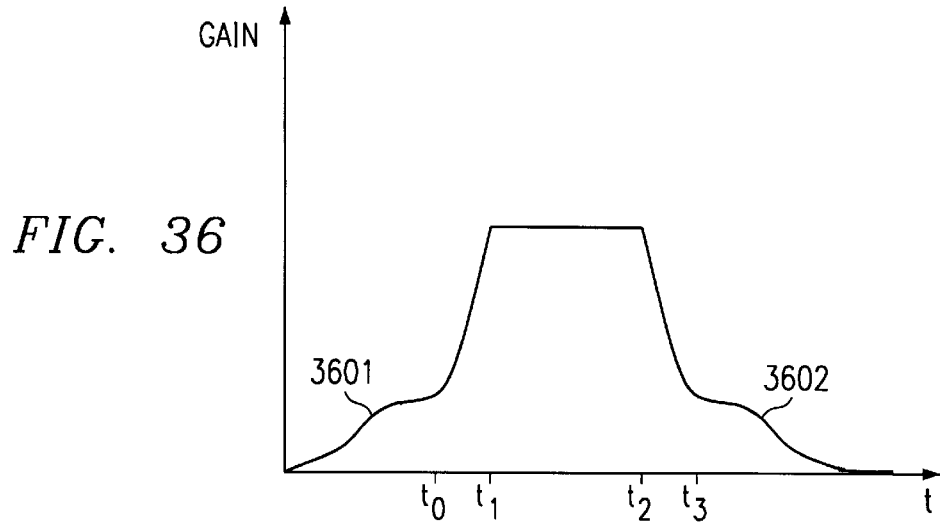
FIG. 36 illustrates an average power curve of the embodiment of the present invention described in FIG. 35.

Turning now to FIG. 36, shown is an average power curve demonstrating application of the modified gain factor curve of FIG. 35. As can be clearly seen, there are periods 3601, 3602 of soft start and soft stop which eliminate a hard transition.

Figure 37:
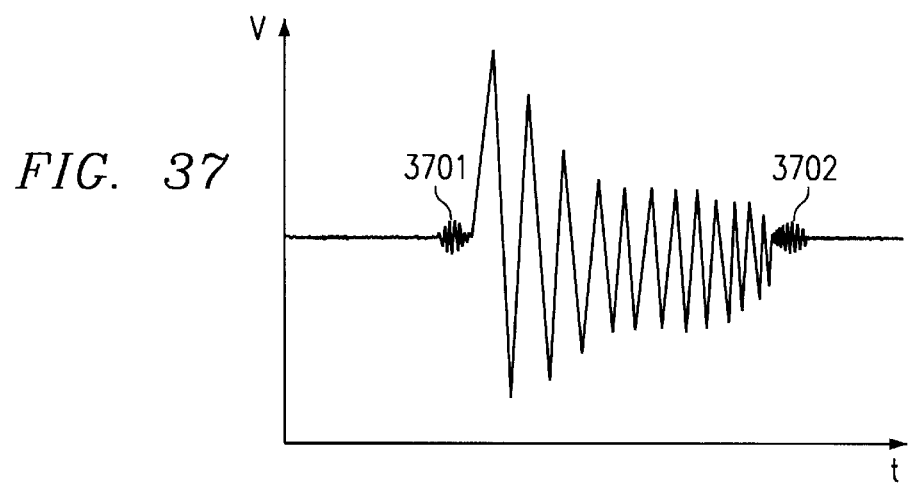
FIG. 37 illustrates an output signal and envelope processed by the embodiment of the present invention described in FIGS. 34–36.

Turning now to FIG. 37, shown is an output signal produced when the method as described in FIGS. 34–36 is applied to the input signal 501 of FIG. 5. The lobes 3701, 3702 are still present. However, they now have longer attack and decay times, thereby lessening the severity of their introduction.

Figure 38:
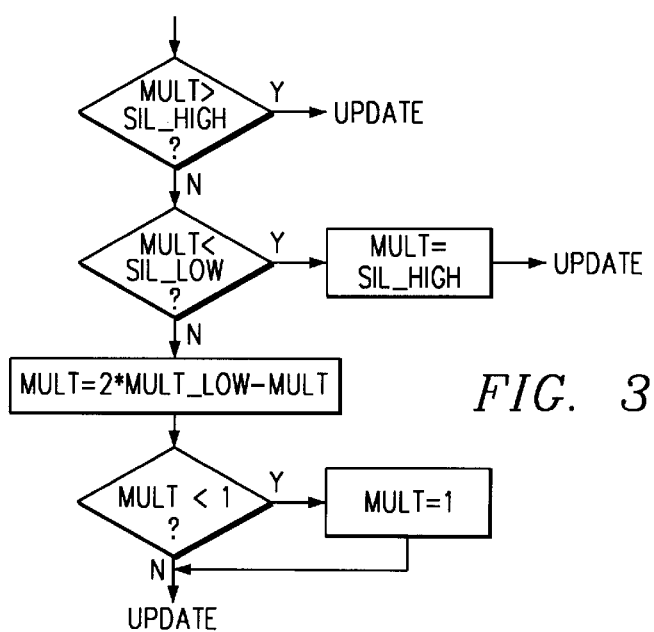
FIG. 38 illustrates a flow diagram for the method described in FIGS. 34–37.

Turning now to FIG. 38, shown is a flow diagram embodying the method described in FIGS. 34–37. Briefly, the method shown in FIG. 38 establishes a hysteresis band, or a band of allowable gain factor values, within which the modified gain factor is allowed to exist. Furthermore, the method allows for transition of values at a predetermined maximum rate within the hysteresis band, thereby ridding the output signal of "bang-bang" transitions and reducing the lobes 3701, 3702.

Figure 39:
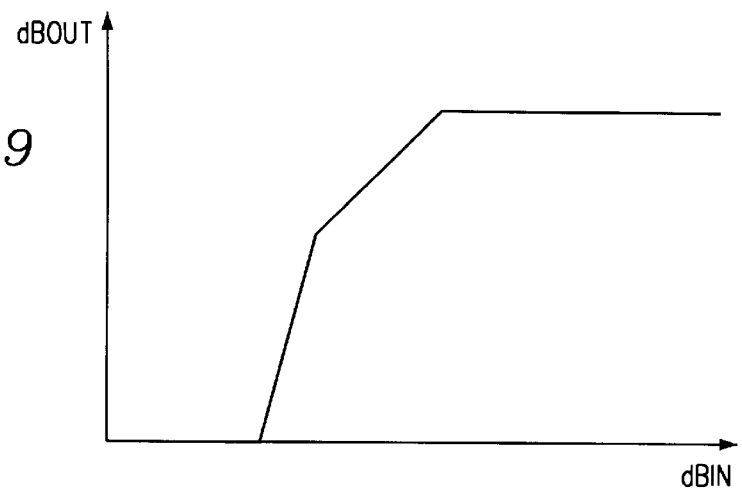
FIG. 39 illustrates a gain curve for the method described in FIGS. 34–40.

Turning now to FIG. 39, shown is an initial gain factor curve which is similar to that shown in FIGS. 22, 28 and 34. Again, the curve shown in FIG. 40 provides for extremely high gain during periods 4001, 4002 of silence.

Figure 40:
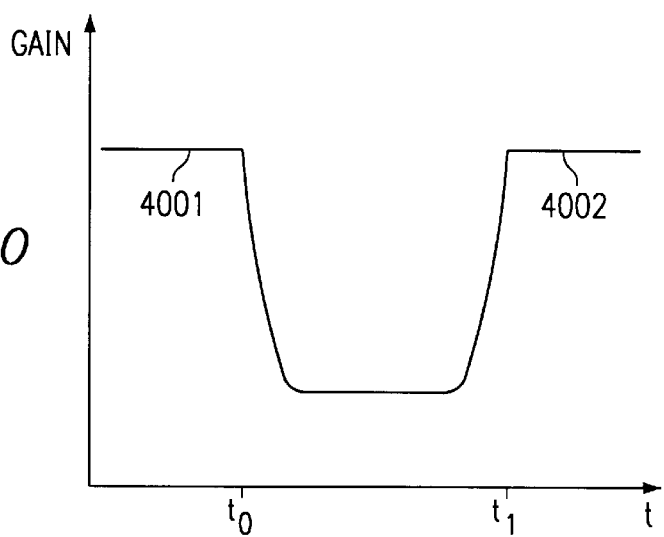
FIG. 40 illustrates an initial gain factor curve.
Figure 41:
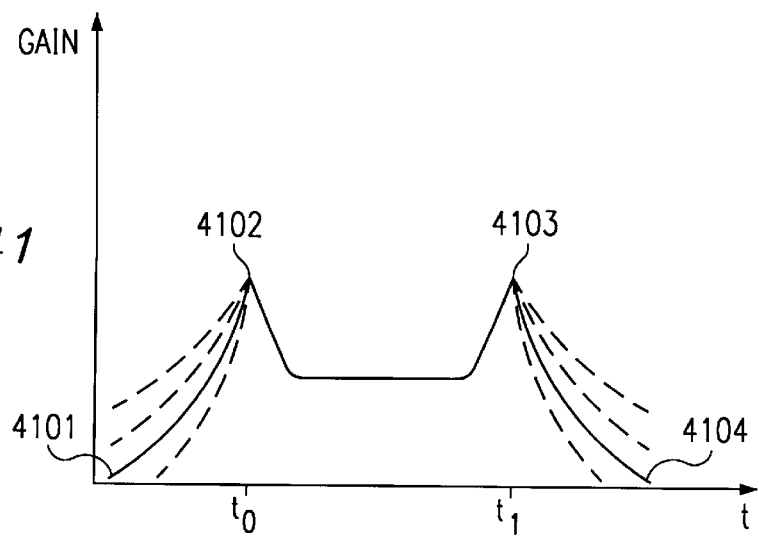
FIG. 41 illustrates the initial gain factor curve of FIG. 42 as modified by an alternative embodiment of the present invention.

Turning now to FIG. 41, shown is the initial gain factor curve of FIG. 40 as modified by another alternative embodiment of the present invention. Again, the method comes into play when the initial gain factor exceeds a predetermined maximum, thereby indicating silence. In the example shown in FIG. 41, there remains a soft transition from zero gain or unitary gain, shown by point 4101 to a maximum gain, shown by point 4102. Conversely, from point of maximum gain 4103, there is an orderly, soft transition to zero or unitary gain at point 4104. In the example shown in FIG. 41, the transitions between points 4101 and 4102 or 4103 and 4104 may be rectilinear or curvilinear and may be of any desired slope. Under different conditions, i.e. differing signal-to-noise ratios or absolute signal or absolute noise values, it may be desirable to supply different values of change or curvature. The method described in FIGS. 40 and 41 allows for this. Finally, particular note should be taken that the method described in FIGS. 40 and 41 does not provide for a finite dwell time at a maximum value as shown in FIG. 35 in regions 3503 and 3504. This serves further to reduce lobe size.

Figure 42:
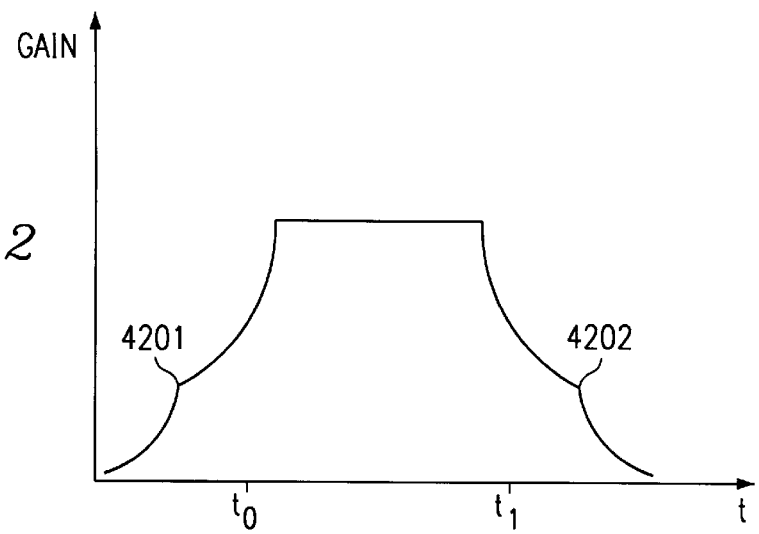
FIG. 42 illustrates an average power curve for the method described in FIGS. 42–43.

Turning now to FIG. 42, shown is an average power curve which results by application of the curve of FIG. 41. Notice that lobes 4201, 4202 have become minimal in size, almost disappearing from the curve. This essentially eliminates their effect. This further heightens the fidelity of the output signal.

Figure 43:
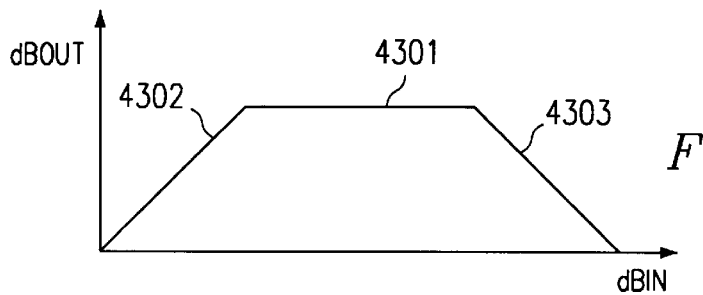
FIG. 43 illustrates the gain curve for the method described in FIGS. 42–44.

Turning now to FIG. 43, shown is a gain curve which indicates, for the first time, that there is an allowable region 4301 within which the input signal is allowed to remain at a constant level, in the best mode of the invention, any level between −30 dBm and +6 dBm will become −9 dBm at the output. Outside of that region, however, there are now two regions within which gain is restricted. A first region 4302 restricts output when input is at a low level, i.e., silence. A second region 4303 acts to limit the output level when input levels are extremely high, thereby eliminating distorting peaks in sound.

Figure 44:
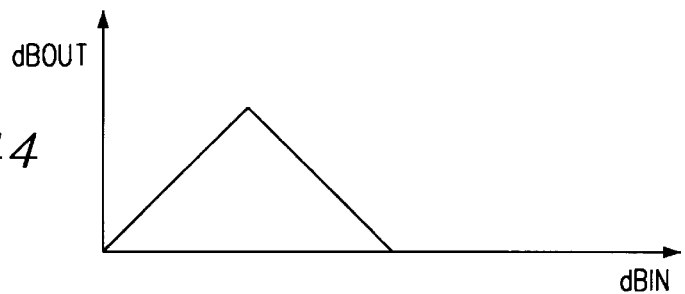
FIG. 44 illustrates an alternative gain curve for the method described in FIGS. 42–44.

FIG. 44 shows the gain curve of FIG. 43, demonstrating that it can be moved and that the range 4301 may be narrowed to a single point, thereby narrowing that range within which the input signal is held to a constant output level.

Figure 45:
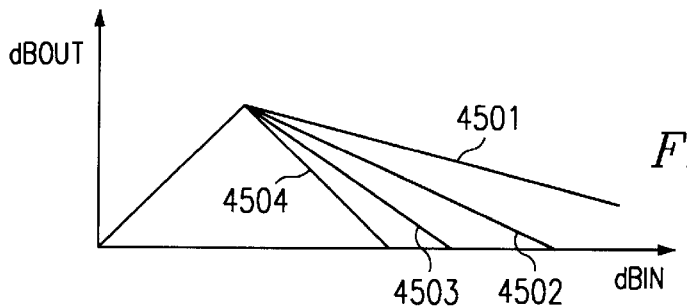
FIG. 45 illustrates another alternative gain curve for the method described in FIGS. 42–44.

Turning now to FIG. 45, shown is a gain curve having a plurality of decay regions 4501, 4502, 4503, 4504, each having a different slope. The curve in FIG. 45 demonstrates the degree to which the output signal may be modified as a function of the input signal level depending on the extent to which the slope of the modified gain factor is changed.

Up to this point, the primary object of the described embodiments of the present invention has been to discern periods of silence from periods of nonsilence, or speech. In doing so, however, the speech that results has been distorted somewhat, typified by the output signal as shown in FIG. 31, wherein a portion of speech is overamplified at the beginning. Accordingly, in the final two figures to be presented, it will be the object to diminish the effects of this overamplification.

Figure 46:
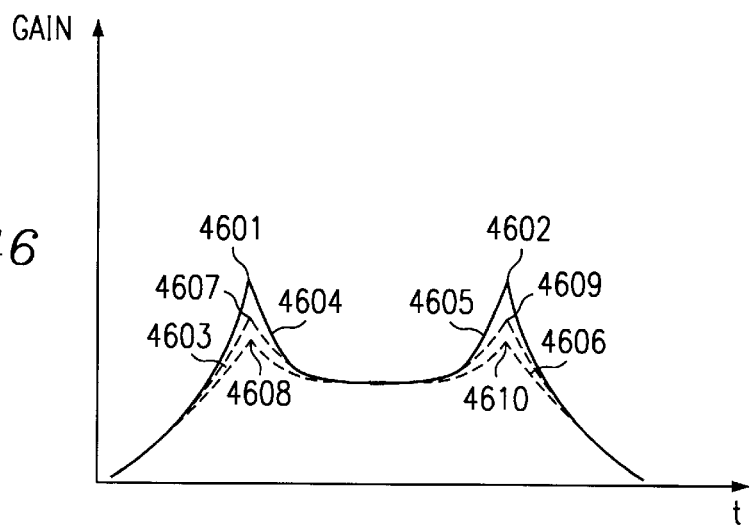
FIG. 46 illustrates a modified gain factor curve embodying the method described in FIGS. 42–44 and further adjusting for rapid gain rise.

Turning now to FIG. 46, shown is a modified gain factor curve of the type originally presented in FIG. 41. The curve in 46 shows two peaks 4601, 4602. Peak 4601 marks a transition from a region of rise 4603 to a region of fall 4604, while peak 4602 marks a transition from a period of rise 4605 to a period of fall 4606. In its simplest terms, it is desired to smooth the transition from periods of rapid rise to rapid fall by "trimming" the peak there between. Accordingly, FIG. 46 shows a plurality of lesser peaks 4607, 4608, 4609, 4610 which, to varying degrees, decrease the height of peaks 4601, 4602.

These smoother transitions are accomplished by examining input signal points as they are received and limiting the change in gain allowed from point to point to a certain maximum rate. This serves to enforce a maximum possible rise or fall on the curves, thereby flattening them when they tend to change too steeply. By setting different maximum rates, peaks can be flattened to different extents.

Figure 47:
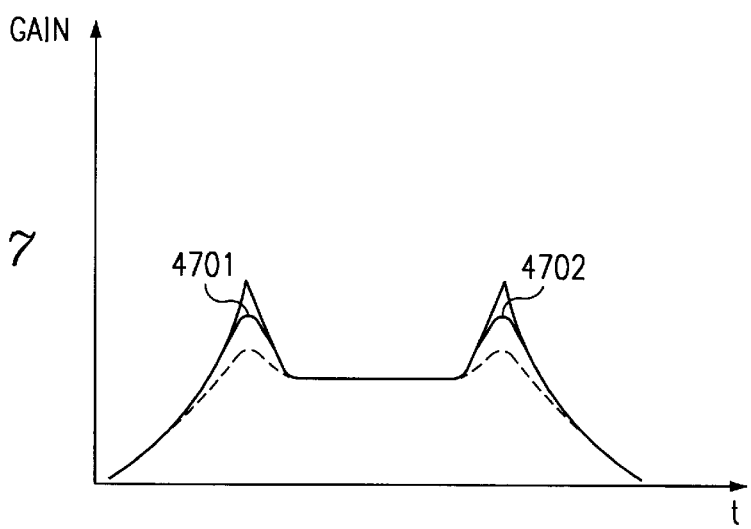
FIG. 47 illustrates the modified gain factor curve of FIG. 50 as further adjusted for absolute initial gain factor level.

Turning now to FIG. 47, shown is a further enhancement to the technique shown in FIG. 46. In FIG. 47, the peaks 4701, 4702 are rounded. This is accomplished by not only setting an allowable maximum rate of change, but decreasing that allowable maximum rate of change as a function of the absolute value of the initial gain factor. Therefore, as the initial gain factor approaches an allowable maximum level, the degree to which the gain factor is allowed to change is decreased, thereby rounding off the curve. To accomplish the techniques described in FIGS. 46 and 47, the method for limiting gain factor change is accomplished by setting predetermined maximum rise and fall levels or setting rates of allowed predetermined maximum rise or fall as a function of the absolute value of the initial gain factor.

Figure 48:
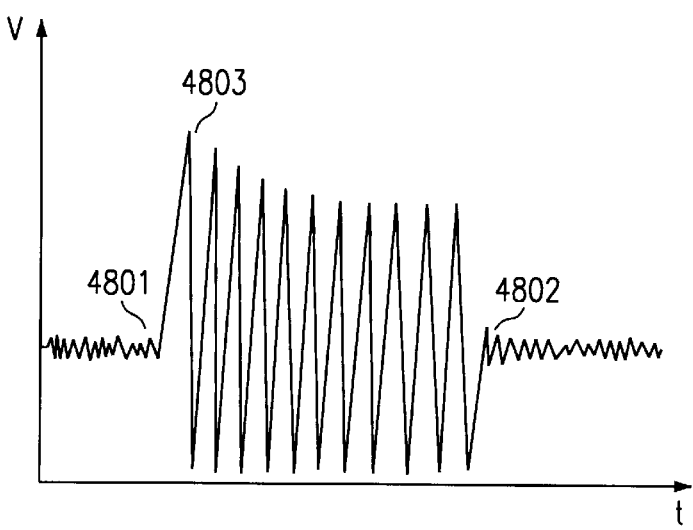
FIG. 48 illustrates an output signal and envelope processed by the embodiment of the present invention described in FIG. 46.

Accordingly, in FIG. 48, shown is an output signal which has been processed by an AGC embodying the methods described in FIGS. 46 and 47. Notice that lobes 4801, 4802 are essentially missing. Furthermore, note that peak 4803 has been significantly deemphasized. By employing the techniques described in FIGS. 46 and 47, the output signal, shown in FIG. 48, is of high fidelity (not initially overamplified), and the period of silence between the period of nonsilence, or speech, are brought to a practical minimum, thereby emphasizing the speech to the listener.

Figure 49:
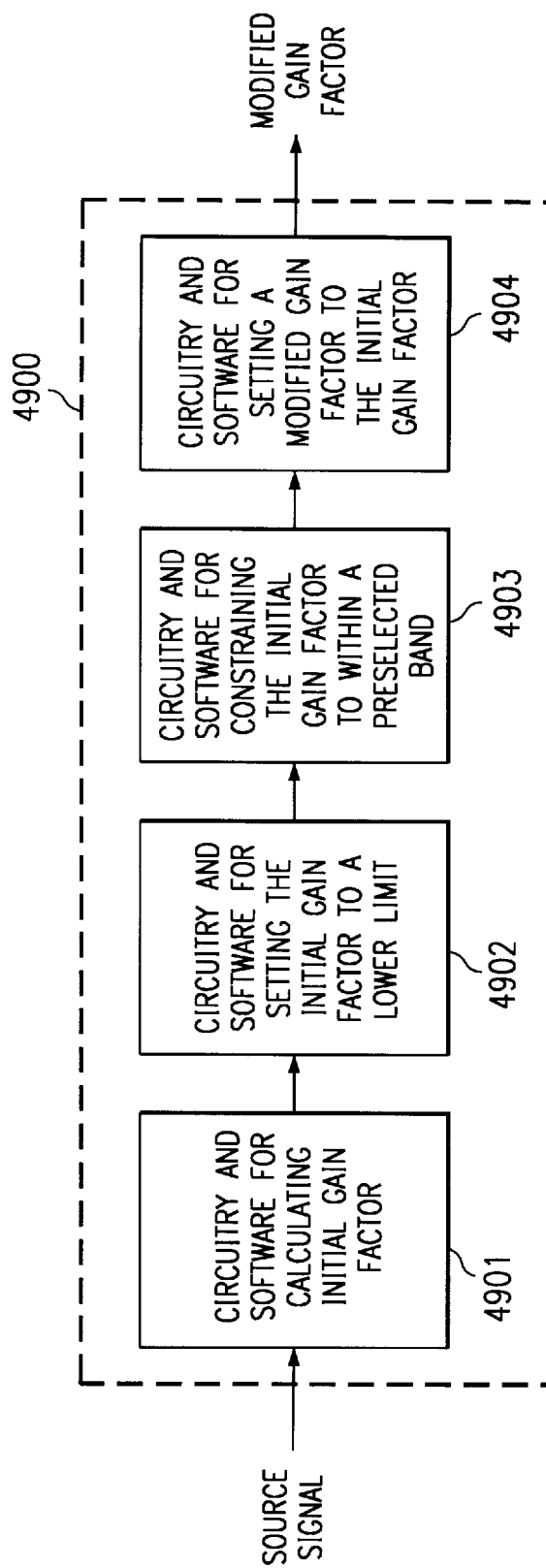
FIG. 49 illustrates a preferred embodiment of circuitry for automatically controlling signal gain according to the present invention.

A preferred embodiment of circuitry for providing the modified gain factor of the present invention is illustrated in FIG. 49. Here box 4900 includes the circuitry for providing the modified gain factor of which: box 4901 is circuitry and software for calculating an initial gain factor from a source signal; box 4902 is circuitry and software for setting the initial gain factor equal to a lower limit of a preselected ban of allowable values when the source signal is below a preselected minimum level, the setting circuitry and software producing thereby a modified gain factor; box 4903 is circuitry and software for constraining the initial gain factor to within the preselected band when the source signal is above the preselected minimum level and the initial gain factor is above the preselected band, the constraining circuitry and software producing thereby the modified gain factor; and box 4904 is circuitry and software for setting the modified gain factor equal to the initial gain factor when the initial gain factor is within or below the preselected band. It shall be appreciated that the circuitry of box 4900 may be coupled to circuitry and software for multiplying an input signal of variable power by the modified gain factor to produce an output signal of selected, substantially constant, power. Accordingly, it shall be appreciated that the circuitry of FIG. 49 may be operated in the feedback or feed forward circuits of FIGS. 3 and 4 by replacing analysis circuitry 302 or 402, respectively, with box 4900.

From the foregoing, it is apparent that the present invention provides a method of minimizing distortion due to widely varying signal levels, comprising the steps of calculating an initial gain factor from a source signal and gradually varying the initial gain factor to within a preselected band of allowable values when the source signal is above a preselected minimum level and the initial gain factor is above the preselected band.

Although the present invention and its advantages have been described in detail, it should be understood that various changes, substitutions and alterations can be made herein without departing from the spirit and scope of the invention as defined by the appended claims.

What is claimed is:

1. In an amplifier using automatic gain control, a method of minimizing distortion of an output signal from said amplifier in response to wide level variations in a source signal, said method comprising the steps of:
    monitoring the source signal level;
    calculating an initial gain factor required to modify the source signal level according to said automatic gain control; and
    gradually modifying the initial gain factor to within a preselected band of allowable values when the source signal is monitored above a preselected minimum level and the initial gain factor is monitored above said preselected band;
    periodically sampling aid source signal to detect instantaneous power levels at particular times; and
    calculating a windowed average power level at a particular point in time by averaging a predetermined number of said instantaneous power levels detected during a predetermined period of time.

2. The method as recited in claim 1 wherein said particular point in time occurs at a beginning of said predetermined period of time.

3. The method as recited in claim 1 wherein said particular point in time occurs at a midpoint in said predetermined period of time.

4. The method as recited in claim 1 wherein said particular point in time occurs at an end of said predetermined period of time.

5. The method as recited in claim 1 wherein said initial gain factor is a function of said windowed average power level.

6. The method as recited in claim 1 wherein an input signal functions as said source signal.

7. The method as recited in claim 1 wherein the output signal functions as said source signal.

8. The method as recited in claim 1 wherein said initial gain factor changes within said preselected band at a preselected rate.

9. The method as recited in claim 8 wherein said preselected rate varies over time.

10. The method as recited in claim 8 wherein said preselected rate changes as a function of a rate at which said initial gain factor varies.

11. The method as recited in claim 8 wherein said preselected rate changes as a function of a value of said initial gain factor.

12. The method as recited in claim 1 wherein a lower limit of said preselected band is zero gain.

13. The method as recited in claim 1 wherein a lower limit of said preselected band is unitary gain.

14. In an amplifier using automatic gain control, a system for minimizing distortion of an output signal from said amplifier in response to wide level variations in a source signal, comprising:
    means for monitoring the source signal level;
    means for calculating an initial gain factor required to modify the source signal level according to said automatic gain control; and
    means for gradually modifying the initial gain factor to within a preselected band of allowable values when the source signal is monitored above a preselected minimum level and the initial gain factor is monitored above said preselected band;
    means for periodically sampling said source signal to detect instantaneous power levels at particular times; and
    means for calculating a windowed average power level at a particular point in time by averaging a predetermined number of instantaneous power levels detected during a predetermined period of time.

15. The system as recited in claim 14 wherein said particular point in time occurs at a beginning of said predetermined period of time.

16. The system as recited in claim 14 wherein said particular point in time occurs at a midpoint in said predetermined period of time.

17. The system as recited in claim 14 wherein said particular point in time occurs at an end of said predetermined period of time.

18. The system as recited in claim 14 wherein said initial gain factor is a function of said windowed average power level.

19. The system as recited in claim 14 wherein an input signal functions as said source signal.

20. The system as recited in claim 14 wherein the output signal functions as said source signal.

21. The system as recited in claim 14 wherein said initial gain factor changes within said preselected band at a preselected rate.

22. The system as recited in claim 21 wherein said preselected rate varies over time.

23. The system as recited in claim 21 wherein said preselected rate changes as a function of a rate at which said initial gain factor varies.

24. The system as recited in claim 21 wherein said preselected rate changes as a function of a value of said initial gain factor.

25. The system as recited in claim 14 wherein a lower limit of said preselected band is zero gain.

26. The system as recited in claim 14 wherein a lower limit of said preselected band is unitary gain.

27. In an amplifier using automatic gain control, a method of maintaining an output signal from said amplifier at a preselected, substantially constant level, said method comprising the steps of:
   calculating an initial gain factor from a source signal according to said automatic gain control;
   establishing a modified gain factor from said initial gain factor, the establishing step including the substeps of:
      setting said initial gain factor equal to a lower limit of a preselected band of allowable values when said source signal is below a preselected minimum level, said step of setting thereby producing said modified gain factor;
      moving said initial gain factor to within said preselected band when said source signal is above said preselected minimum level and said initial gain factor is above said preselected band, said step of moving thereby producing said modified gain factor; and
      making said modified gain factor equal to said initial gain factor when said initial gain factor is within or below said preselected band; and
   multiplying an input signal by said modified gain factor.

28. The method as recited in claim 27 wherein said source signal is periodically sampled to detect instantaneous power levels at particular times.

29. The method as recited in claim 28 wherein a windowed average power level at a particular point in time is calculated by averaging a predetermined number of instantaneous power levels detected during a predetermined period of time.

30. The method as recited in claim 29 wherein said particular point in time occurs at a beginning of said predetermined period of time.

31. The method as recited in claim 29 wherein said particular point in time occurs at a midpoint in said predetermined period of time.

32. The method as recited in claim 29 wherein said particular point in time occurs at an end of said predetermined period of time.

33. The method as recited in claim 29 wherein said initial gain factor is a function of said windowed average power level.

34. The method as recited in claim 27 wherein said input signal functions as said source signal.

35. The method as recited in claim 27 wherein said output signal functions as said source signal.

36. The method as recited in claim 27 wherein said modified gain factor changes within said preselected band at a preselected rate.

37. The method as recited in claim 36 wherein said preselected rate varies over time.

38. The method as recited in claim 36 wherein said preselected rate varies as a function of a rate at which said initial gain factor varies.

39. The method as recited in claim 36 wherein said preselected rate varies as a function of a value of said initial gain factor.

40. The method as recited in claim 27 wherein said lower limit of said preselected band is zero gain.

41. The method as recited in claim 27 wherein said lower limit of said preselected band is unitary gain.

42. In an amplifier using automatic gain control, a circuit for maintaining an output signal from said amplifier at a pre-selected, substantially constant level, comprising:
   means for calculating an initial gain factor from a source signal according to said automatic gain control;
   means for changing said initial gain factor to a modified gain factor, said changing means further comprising:
      means for setting said initial gain factor equal to a lower limit of a preselected band of allowable values when said source signal is below a preselected minimum level, said setting means thereby producing said modified gain factor;
      means for moving said initial gain factor to within said preselected band when said source signal is above said preselected minimum level and said initial gain factor is above said preselected band, said moving means thereby producing said modified gain factor; and
      means for making said modified gain factor equal to said initial gain factor when said initial gain factor is within or below said preselected band; and
   means for multiplying an input signal by said modified gain factor.

43. The circuit as recited in claim 42 wherein said source signal is periodically sampled to detect instantaneous power levels at particular times.

44. The circuit as recited in claim 43 wherein a windowed average power level at a particular point in time is calculated by averaging a predetermined number of instantaneous power levels detected during a predetermined period of time.

45. The circuit as recited in claim 44 wherein said particular point in time occurs at a beginning of said predetermined period of time.

46. The circuit as recited in claim 44 wherein said particular point in time occurs at a midpoint in said predetermined period of time.

47. The circuit as recited in claim 44 wherein said particular point in time occurs at an end of said predetermined period of time.

48. The circuit as recited in claim 44 wherein said initial gain factor is a function of said windowed average power level.

49. The circuit as recited in claim 42 wherein said input signal functions as said source signal.

50. The circuit as recited in claim 42 wherein said output signal functions as said source signal.

51. The circuit as recited in claim 42 wherein said gain factor changes within said preselected band at a preselected rate.

52. The circuit as recited in claim 31 wherein said preselected rate varies over time.

53. The circuit as recited in claim 31 wherein said preselected rate varies as a function of a rate at which said initial gain factor varies.

54. The circuit as recited in claim 31 wherein said preselected rate varies as a function of a value of said initial gain factor.

55. The circuit as recited in claim 42 wherein said lower limit of said preselected band is zero gain.

56. The circuit as recited in claim 42 wherein said lower limit of said preselected band is unitary gain.

57. In an amplifier using automatic gain control, a method of minimizing distortion of an output signal from said amplifier in response to wide level variations in a source signal, said method comprising the steps of:

monitoring the source signal level, said monitoring step including the substeps of:

periodically sampling said source signal to detect levels thereof at predetermined times;

identifying a predetermined time window in said sample stream; and averaging said sample levels within said time window to determine a windowed average level;

calculating an initial gain factor as a predetermined function of the windowed average level; and at a predetermined controlled rate of change, modifying the initial gain factor to within a preselected band of allowable values when the source signal is monitored above a preselected minimum level and the initial gain factor is monitored above said preselected band, said predetermined controlled rate of change being a function of the value of the initial gain factor.

58. In an amplifier using automatic gain control, a system for minimizing distortion of an output signal from said amplifier in response to wide level variations in a source signal, the system comprising:

means for monitoring the source signal level, said monitoring means including:

means for periodically sampling said source signal to detect levels thereof at predetermined times;

means for identifying a predetermined time window in said sample stream; and means averaging said sample levels within said time window to determine a windowed average level;

means for calculating an initial gain factor as a predetermined function of the windowed average level; and means for modifying, at a predetermined controlled rate of change, the initial gain factor to within a preselected band of allowable values when the source signal is monitored above a preselected minimum level and the initial gain factor is monitored above said preselected band, said predetermined controlled rate of change being a function of the value of the initial gain factor.

\* \* \* \* \*